(12) United States Patent
Matsuo

(10) Patent No.: US 9,793,876 B2
(45) Date of Patent: Oct. 17, 2017

(54) RESONATOR ELEMENT, METHOD FOR MANUFACTURING RESONATOR ELEMENT, RESONATOR, GYRO SENSOR, ELECTRONIC APPARATUS, AND MOVING OBJECT

(71) Applicant: SEIKO EPSON CORPORATION, Tokyo (JP)

(72) Inventor: Atsushi Matsuo, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 151 days.

(21) Appl. No.: 14/746,128

(22) Filed: Jun. 22, 2015

(65) Prior Publication Data
US 2015/0381143 A1 Dec. 31, 2015

(30) Foreign Application Priority Data

Jun. 30, 2014 (JP) ................................. 2014-134024

(51) Int. Cl.
| | |
|---|---|
| *H03H 9/21* | (2006.01) |
| *H03H 9/215* | (2006.01) |
| *H03H 3/02* | (2006.01) |
| *G01C 19/5747* | (2012.01) |
| *G01C 19/5769* | (2012.01) |

(52) U.S. Cl.
CPC ......... *H03H 9/215* (2013.01); *G01C 19/5747* (2013.01); *G01C 19/5769* (2013.01); *H03H 3/02* (2013.01); *H03H 2003/026* (2013.01)

(58) Field of Classification Search
CPC ...................................................... H03H 9/215
USPC ........................................................... 310/370
See application file for complete search history.

(56) References Cited

U.S. PATENT DOCUMENTS

| | | | | |
|---|---|---|---|---|
| 4,191,906 | A * | 3/1980 | Kogure | H03H 9/215 310/312 |
| 4,771,202 | A * | 9/1988 | Takahashi | G04F 5/063 310/312 |
| 9,319,022 | B2 * | 4/2016 | Yamada | H03H 9/215 |
| 2005/0140252 | A1 | 6/2005 | Miyata et al. | |
| 2011/0043079 | A1 * | 2/2011 | Shirai | H03H 9/0519 310/365 |
| 2013/0020915 | A1 * | 1/2013 | Sakamoto | H03H 3/02 310/370 |
| 2015/0137900 | A1 * | 5/2015 | Yamada | H03H 9/215 331/156 |

(Continued)

FOREIGN PATENT DOCUMENTS

| | | | | |
|---|---|---|---|---|
| JP | 54113297 | A * | 9/1979 | ............. H03H 9/215 |
| JP | 56068019 | A * | 6/1981 | ............. H03H 9/215 |

(Continued)

*Primary Examiner* — J. San Martin
(74) *Attorney, Agent, or Firm* — Oliff PLC

(57) ABSTRACT

To improve durability against impact, a quartz crystal resonator element includes a recess in a plan view. The quartz crystal resonator element further includes a first principal surface and a second principal surface that are front and rear surfaces facing away from each other and a side surface disposed between the first principal surface and the second principal surface, and the side surface is formed of flat surfaces and curved surfaces formed by dry etching and alternately arranged. The quartz crystal resonator element preferably has a base and at least one resonating arm extending from the base.

15 Claims, 22 Drawing Sheets

(56) References Cited

U.S. PATENT DOCUMENTS

| | | | |
|---|---|---|---|
| 2016/0028370 A1* | 1/2016 | Nakagawa | H03H 3/02 |
| | | | 310/370 |
| 2016/0260887 A1* | 9/2016 | Fujii | H01L 41/0475 |

FOREIGN PATENT DOCUMENTS

| | | | | |
|---|---|---|---|---|
| JP | 2003-060474 A | | 2/2003 | |
| JP | 2005-184767 A | | 7/2005 | |
| JP | 2007-208670 A | | 8/2007 | |
| JP | 2011-239132 A | | 11/2011 | |
| JP | 2011-239133 A | | 11/2011 | |
| JP | 2013232944 A | * | 11/2013 | H03H 9/0519 |
| JP | 2015023423 A | * | 2/2015 | H03H 9/0547 |
| JP | 2015128268 A | * | 7/2015 | H03B 5/32 |
| JP | 2016146595 A | * | 8/2016 | H03B 5/30 |

* cited by examiner

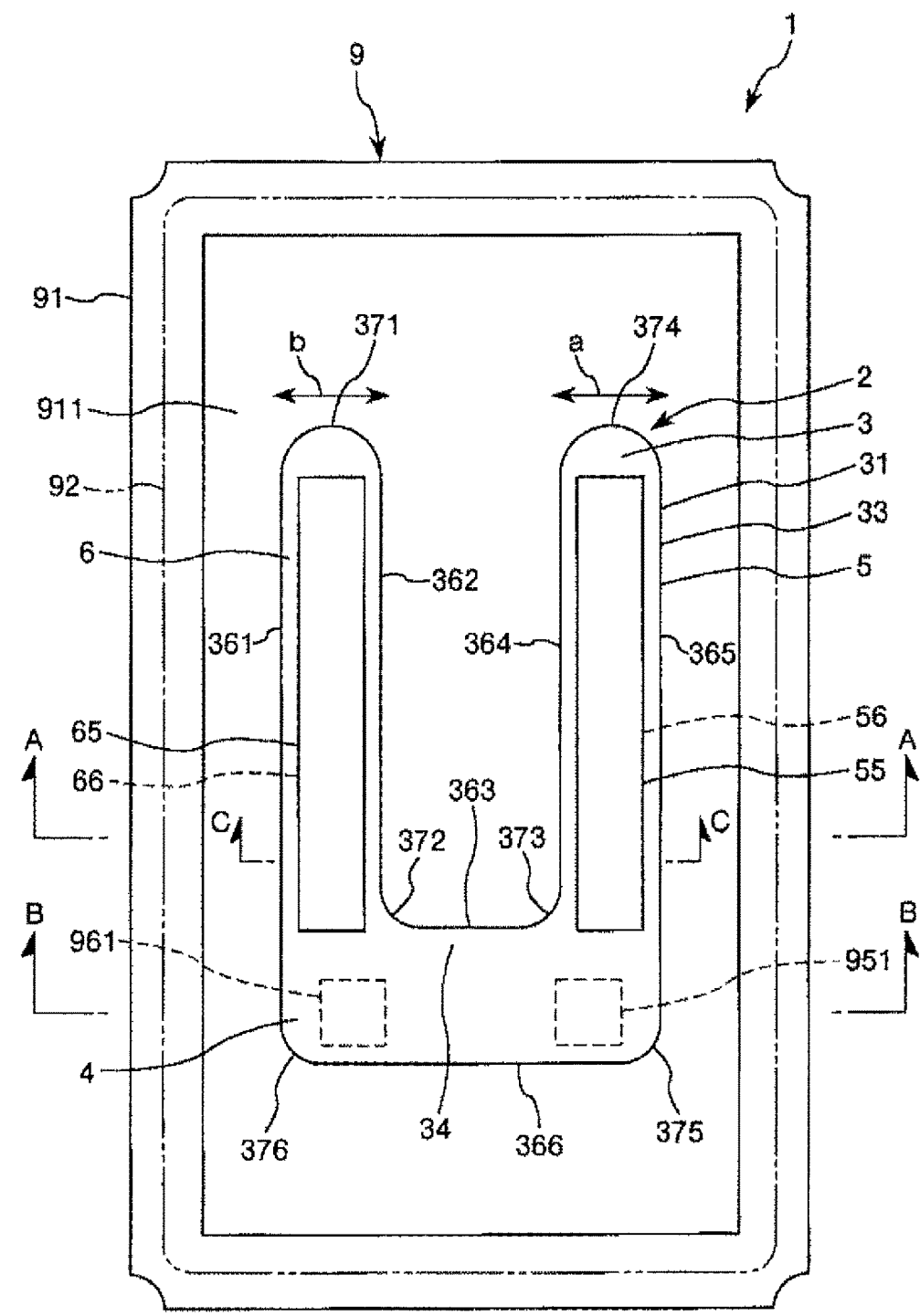
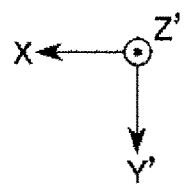
FIG. 1

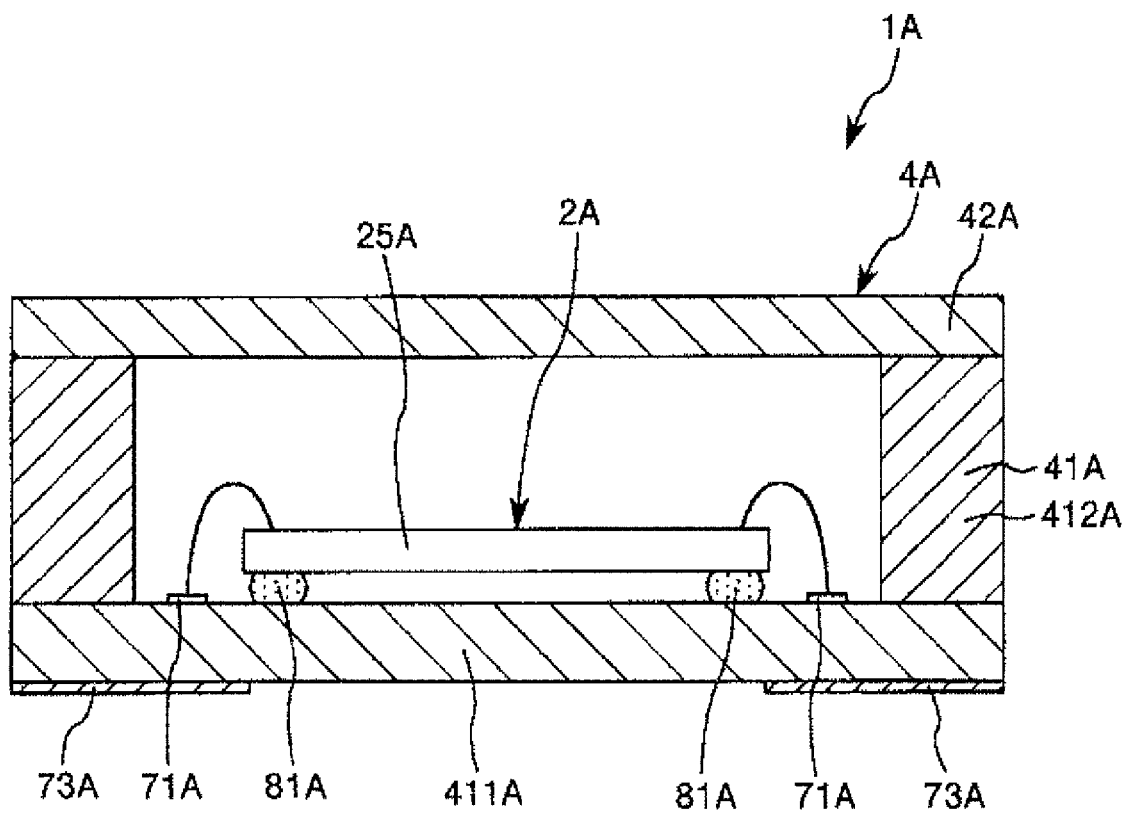
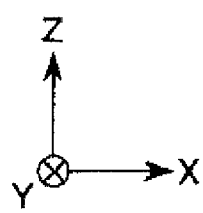
FIG. 10

RESONATOR ELEMENT, METHOD FOR MANUFACTURING RESONATOR ELEMENT, RESONATOR, GYRO SENSOR, ELECTRONIC APPARATUS, AND MOVING OBJECT

BACKGROUND

1. Technical Field

The present invention relates to a resonator element, a method for manufacturing the resonator element, a resonator, a gyro sensor, an electronic apparatus, and a moving object.

2. Related Art

There is a known quartz crystal-based resonator element of related art (see JP-A-2005-184767, for example). A resonator element of this type is widely used, for example, as a reference frequency source in a variety of electronic apparatus, a oscillation source, and a gyro sensor.

The resonator element described in JP-A-2005-184767 has a tuning fork shape and includes a base and a pair of resonating arms extending from the base. Each of the resonating arms has a pair of open grooves formed in the upper and lower surfaces of the resonating arm. The resonator element further has a pair of front and rear principal surfaces that face away from each other and have the grooves formed therein and a side surface that is connected to the pair of principal surfaces.

In the resonator element described in JP-A-2005-184767, however, stress concentration occurs at each corner, resulting in insufficient durability in some cases.

SUMMARY

An advantage of some aspects of the invention is to provide a resonator element that allows improvement in durability, a method for manufacturing the resonator element, a resonator, a gyro sensor, an electronic apparatus, and a moving object.

The invention can be implemented as the following forms or application examples.

Application Example 1

A quartz crystal resonator element according to this application example of the invention includes a first principal surface; a second principal surface that is opposite to the first principal surface; and a side surface that connects the first principal surface and the second principal surface, wherein the side surface is formed of flat surfaces and curve-shaped surfaces formed by dry etching, and the flat surfaces and the curve-shaped surfaces are alternately arranged.

According to the configuration described above, the side surface of the quartz crystal resonator element is unlikely to have a sharp-angled corner, whereby durability of the quartz crystal resonator element against impact can be improved.

Application Example 2

It is preferable that the quartz crystal resonator element according to the application example of the invention further includes a base and at least one resonating arm extending from the base.

In the configuration described above, providing a front-end-side side surface of the resonating arm, that is, the side surface of a protruding portion of the quartz crystal resonator element with a curved surface shape allows improvement in the durability against impact.

Application Example 3

In the quartz crystal resonator element according to the application example of the invention, it is preferable that the resonating arm is formed of a pair of resonating arms, and that a side surface of a valley portion between the pair of resonating arms has the curve-shaped surfaces.

According to the configuration described above, the side surface of the valley portion, that is, the side surface of a recessed portion of the quartz crystal resonator element has the curved surface shape, whereby the durability against impact can be improved.

Application Example 4

In the quartz crystal resonator element according to the application example of the invention, it is preferable that each of the curve-shaped surfaces is a curved surface having a portion where a radius of curvature thereof is greater than or equal to 3 μm but smaller than or equal to 50 μm in a plan view of the first principal surface.

According to the configuration described above, the durability against impact can be further improved.

Application Example 5

In the quartz crystal resonator element according to the application example of the invention, it is preferable that the curve-shaped surfaces include a concavely curved surface and a convexly curved surface, the concavely curved surface has a portion where a radius of curvature thereof is greater than or equal to 5 μm but smaller than or equal to 50 μm in a plan view of the first principal surface, and that the convexly curved surface has a portion where a radius of curvature thereof is greater than or equal to 3 μm but smaller than or equal to 30 μm in the plan view of the first principal surface.

According to the configuration described above, the durability against impact can be further improved.

Application Example 6

In the quartz crystal resonator element according to the application example of the invention, it is preferable that the curve-shaped surfaces include a concavely curved surface and a convexly curved surface, and that an average radius of curvature of the concavely curved surface is greater than the average radius of curvature of the convexly curved surface in a plan view of the first principal surface.

According to the configuration described above, the volume of the front end portion of a protruding portion of the quartz crystal resonator element is increased, and the protruding portion and the recessed portion of the quartz crystal resonator element can be provided with the curved surface shape at the same time.

Application Example 7

A resonator according to this application example of the invention includes the quartz crystal resonator element according to the application example of the invention, and a package that accommodates the quartz crystal resonator element.

According to the configuration described above, the side surface of the quartz crystal resonator element has no sharp corner, whereby durability of the quartz crystal resonator element against impact can be improved.

Application Example 8

A gyro sensor according to this application example includes the quartz crystal resonator element according to the application example of the invention.

According to the configuration described above, the side surface of the quartz crystal resonator element has no sharp corner, whereby durability of the quartz crystal resonator element against impact can be improved.

Application Example 9

An electronic apparatus according to this application example includes the quartz crystal resonator element according to the application example of the invention.

According to the configuration described above, the side surface of the quartz crystal resonator element has no sharp corner, whereby durability of the quartz crystal resonator element against impact can be improved.

Application Example 10

A moving object according to this application example includes the quartz crystal resonator element according to the application example of the invention.

According to the configuration described above, the side surface of the quartz crystal resonator element has no sharp corner, whereby durability of the quartz crystal resonator element against impact can be improved.

Application Example 11

A method for manufacturing a quartz crystal resonator element according to this application of the invention example includes providing a quartz crystal substrate, and performing dry etching on the quartz crystal substrate to form a first principal surface and a second principal surface that are front and rear surfaces facing away from each other and a side surface disposed between the first principal surface and the second principal surface and formed of alternately arranged flat surfaces and curve-shaped surfaces.

According to the method described above, a quartz crystal resonator element that excels in durability against impact can be readily manufactured.

That is, using dry etching allows the side surface of the quartz crystal resonator element to be readily provided with flat surfaces and curve-shaped surfaces with precision. Further, since the side surface of the quartz crystal resonator element has no sharp corner, whereby durability of the quartz crystal resonator element against impact can be improved.

Application Example 12

In the method for manufacturing a quartz crystal resonator element according to the application example of the invention, it is preferable that in the formation of the side surface, the dry etching is performed in a direction that intersects a resonation direction of the quartz crystal resonator element.

According to the method described above, the curve-shaped surface shape that is curved in the direction along the resonation direction of the quartz crystal resonator element can be readily formed with precision.

BRIEF DESCRIPTION OF THE DRAWINGS

The invention will be described with reference to the accompanying drawings, wherein like numbers reference like elements.

FIG. 1 is a plan view of a resonator according to a first embodiment of the invention.

FIG. 10 is a transverse cross-sectional view of the resonator shown in FIG. 9.

FIG. 11A is an enlarged plan view, and FIG. 11B is an enlarged transverse cross-sectional view.

FIG. 12A is an enlarged plan view, and FIG. 12B is an enlarged transverse cross-sectional view.

DESCRIPTION OF EXEMPLARY EMBODIMENTS

A resonator element, a method for manufacturing the resonator element, a resonator, a gyro sensor, an electronic apparatus, and a moving object according to embodiments of the invention will be described below in detail with reference to the accompanying drawings.

1. Resonator

A resonator according to an embodiment of the invention will first be described.

First Embodiment

Figure 2:
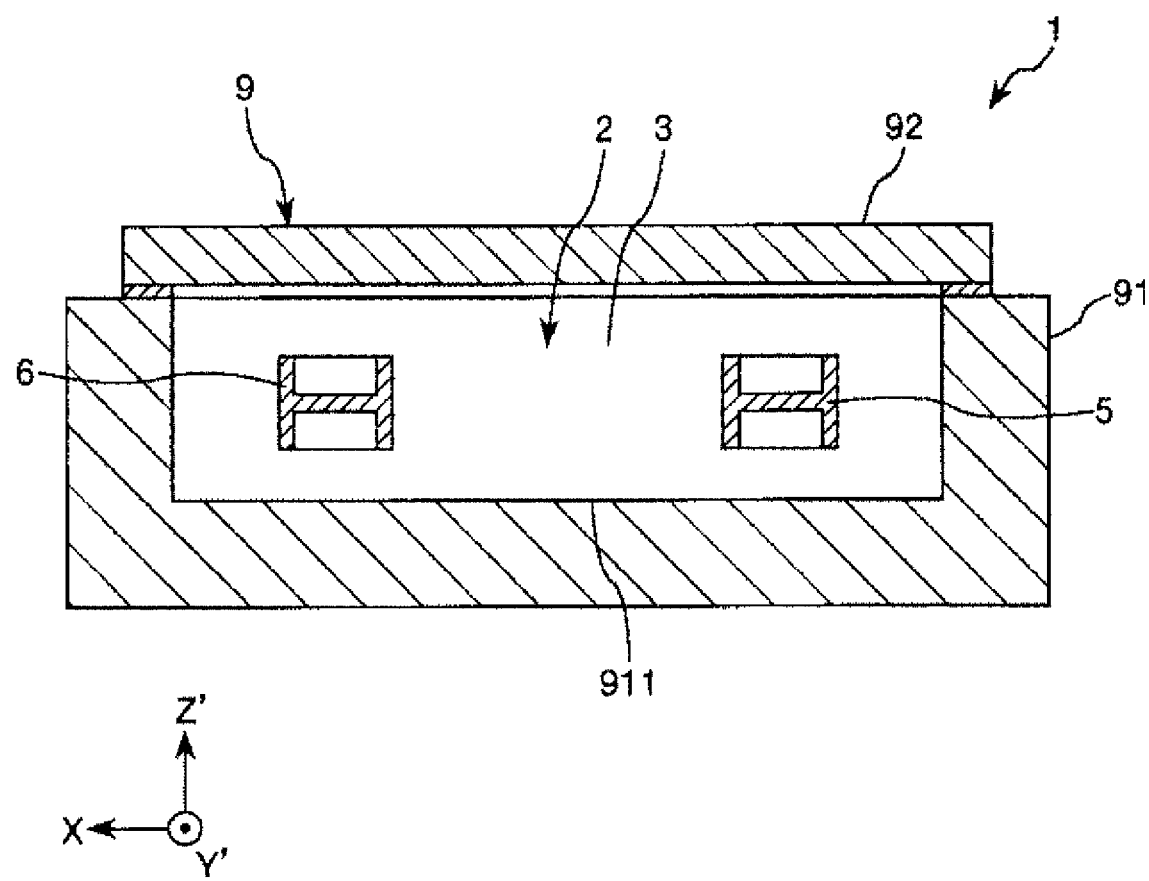
FIG. 2 is a cross-sectional view taken along the line A-A in FIG. 1.
Figure 3:
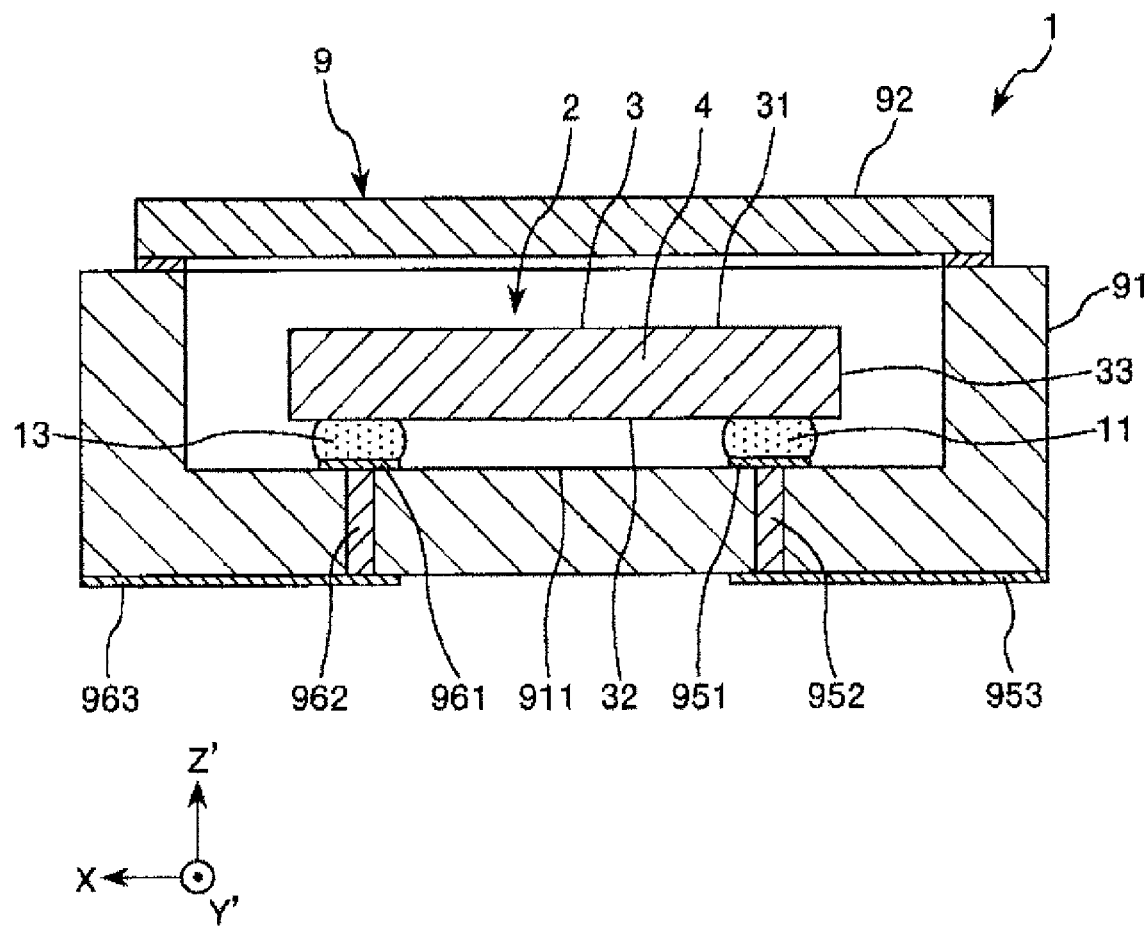
FIG. 3 is a cross-sectional view taken along the line B-B in FIG. 1.
Figure 4:
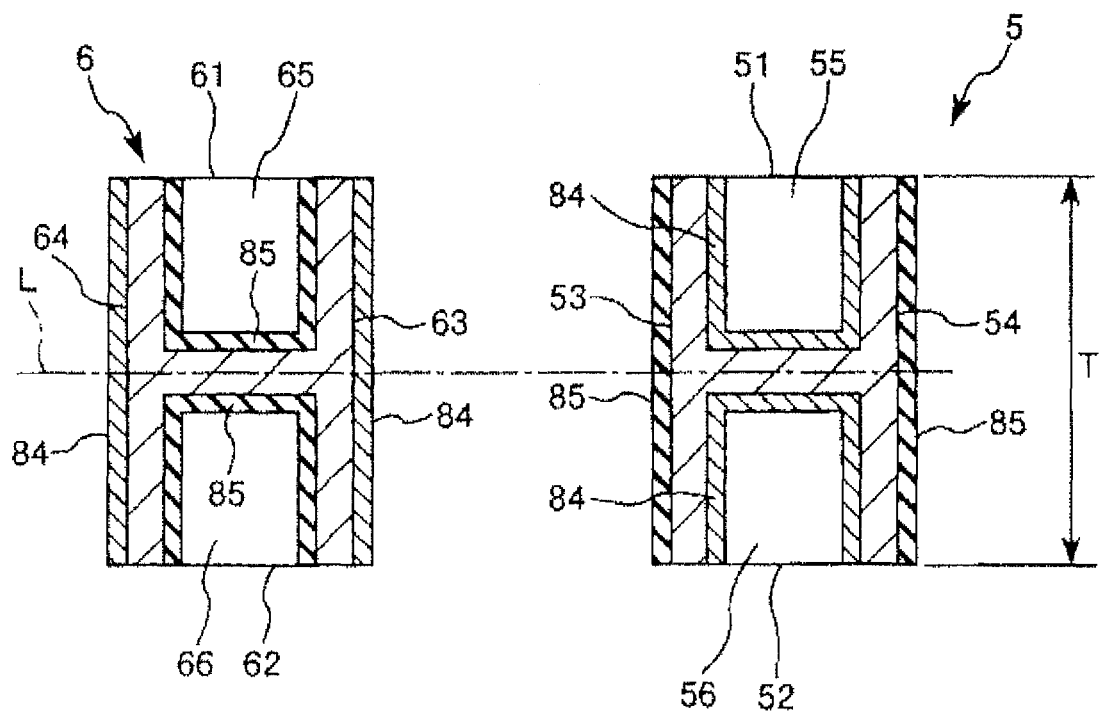
FIG. 4 is a cross-sectional view of a resonator element of the resonator shown in FIG. 1 (cross-sectional view taken along the line C-C in FIG. 1).
Figure 5:
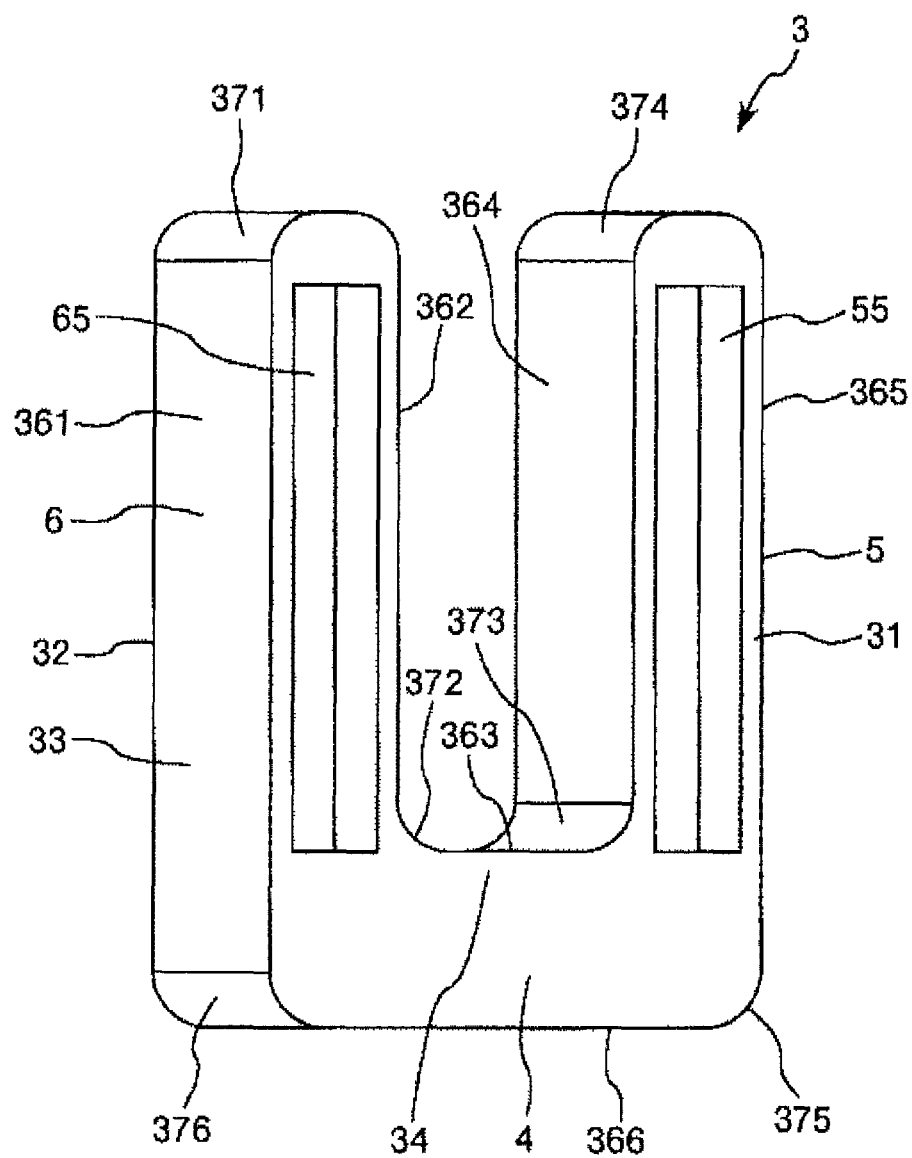
FIG. 5 is a perspective view of a resonation substrate of the resonator element of the resonator shown in FIG. 1.
Figure 6A:
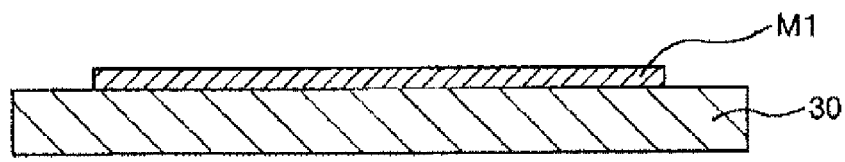
FIGS. 6A to 6D describe a method for manufacturing the resonator element of the resonator shown in FIG. 1.
Figure 6B:
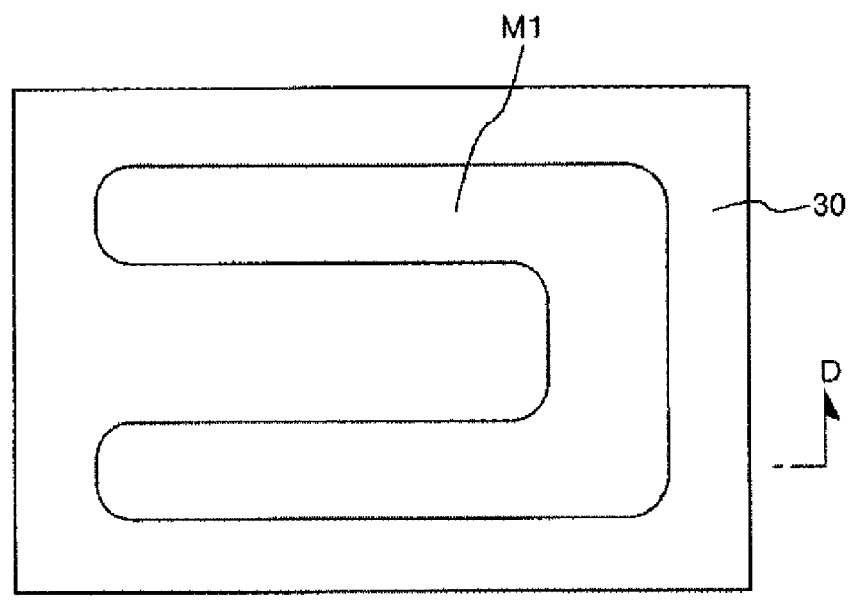
Figure 6C:
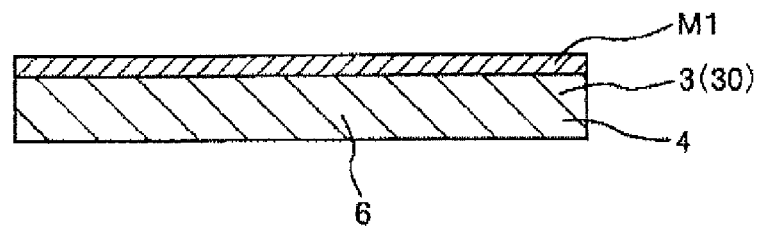
Figure 6D:
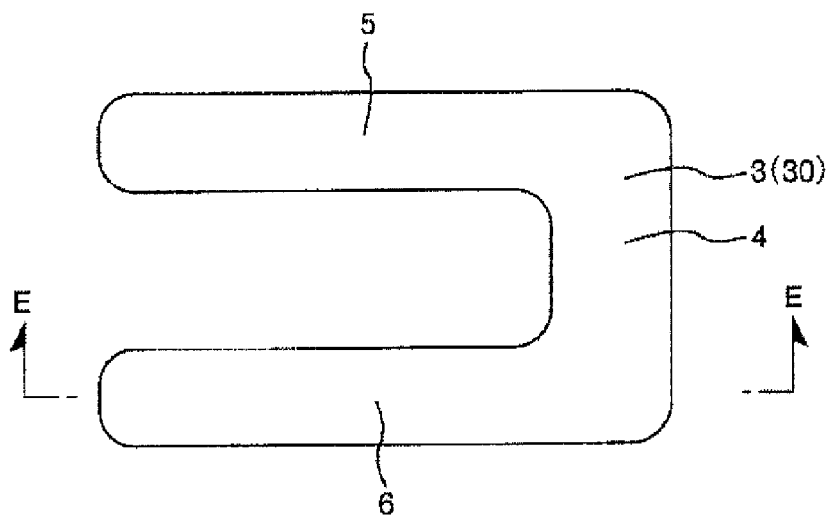
Figure 7A:
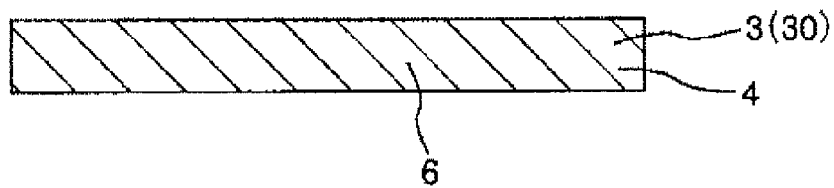
FIGS. 7A to 7D describe the method for manufacturing the resonator element of the resonator shown in FIG. 1.
Figure 7B:
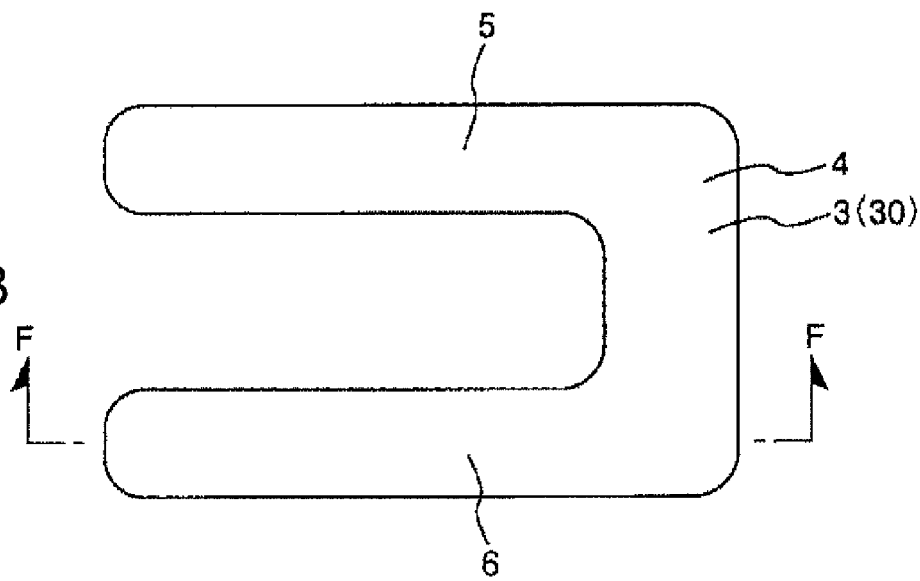
Figure 7C:
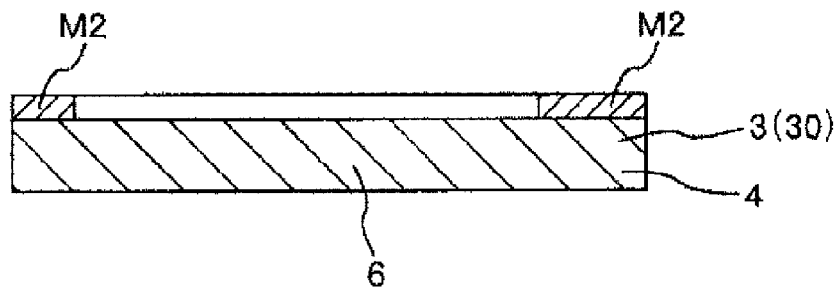
Figure 7D:
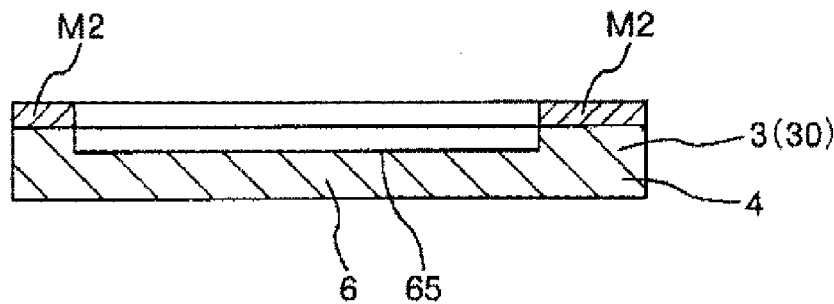

FIG. 1 is a plan view showing a resonator according to a first embodiment of the invention. FIG. 2 is a cross-sectional view taken along the line A-A in FIG. 1. FIG. 3 is a cross-sectional view taken along the line B-B in FIG. 1. FIG. 4 is a cross-sectional view of a resonator element of the resonator shown in FIG. 1 (cross-sectional view taken along the line C-C in FIG. 1). FIG. 5 is a perspective view of a resonation substrate of the resonator element of the resonator shown in FIG. 1. FIGS. 6A to 6D to FIGS. 8A to 8D describe a method for manufacturing the resonator element of the resonator shown in FIG. 1. FIG. 6A is a cross-sectional view taken along the line D-D in FIG. 6B. FIG. 6B is a plan view. FIG. 6C is a cross-sectional view taken along the line E-E in FIG. 6D. FIG. 6D is a plan view. FIG. 7A is a cross-sectional view taken along the line F-F in FIG. 7B. FIG. 7B is a plan view. FIGS. 7C and 7D are cross-sectional views. FIGS. 8A, 8B, 8C, and 8D are cross-sectional views.

A resonator 1 shown in FIGS. 1 to 3 includes a resonator element 2 (resonator element according to an embodiment of the invention) and a package 9, which accommodates the resonator element 2. The resonator element 2 and the package 9 will be sequentially described below in detail.

Resonator Element

The resonator element 2 according to the present embodiment includes a resonation substrate (structural body) 3 and first and second drive electrodes 84, 85 formed on the resonation substrate 3, as shown in FIGS. 1 to 5. In FIGS. 1 and 2, the first and second drive electrodes 84, 85 are omitted for ease of description.

The resonation substrate 3 is formed of a Z-cut quartz crystal plate. A Z-cut quartz crystal plate is a quartz crystal substrate having a Z axis oriented roughly in the thickness direction. In the resonation substrate 3, the thickness direction thereof may coincide with the Z axis, but the Z axis is slightly inclined to the thickness direction from a viewpoint of reduction in frequency-temperature change in the vicinity of room temperature. That is, let θ degrees be the inclination angle ($-5° \leq \theta \leq 15°$), and modify an orthogonal coordinate system having an X axis as the electrical axis of the quartz crystal described above, a Y axis as the mechanical axis thereof, and a Z axis as the optical axis thereof as follows: The Z axis described above is so inclined by the θ degrees that the +Z side thereof is rotated around the X axis described above as an axis of rotation in the −Y direction of the Y axis described above to form a Z' axis; and the Y axis is so inclined by the θ degrees that the +Y side thereof is rotated around the X axis described above in the +Z direction of the Z axis described above to form a Y' axis. The resonation substrate 3 has a thickness in the direction along the Z' axis and a principal plane containing the X axis and the Y' axis. The figures are drawn based on the X axis, the Y' axis, and the Z' axis.

The resonation substrate 3 has a length direction in the Y'-axis direction, a width direction in the X-axis direction, and a thickness direction in the Z'-axis direction. Further, the resonation substrate 3 has roughly the same thickness over the entire region thereof (excluding regions where grooves 55, 56, 65, and 66, which will be described later, are formed). The thickness (length in Z'-axis direction) T of the resonation substrate 3 is not limited to a specific value and preferably greater than or equal to 50 μm but smaller than or equal to 200 μm, more preferably greater than or equal to 90 μm but smaller than or equal to 130 μm. The thus specified thickness allows sufficient mechanical strength, a high Q value, and a low CI value to be achieved and further allows a microscopic shape to be readily fabricated in a dry etching process. That is, when the thickness T of the resonation substrate 3 is smaller than the lower limit described above, the Q value becomes low and the CI value becomes high depending on the other conditions, and the mechanical strength may be insufficient, possibly resulting in breakage of the resonation substrate 3. On the other hand, when the thickness T of the resonation substrate 3 is greater than the upper limit described above, the resonator element 2 could be excessively large.

The resonation substrate 3 has a base 4 and a pair of resonating arms 5 and 6, which extend from the base 4.

The base 4 has a plate-like shape that extends in an XY' plane and has a thickness in the Z'-axis direction.

The resonating arms 5 and 6 are located side by side in the X-axis direction (first direction) and extend (protrude) in parallel to each other in the −Y'-axis direction (second direction) from a −Y'-axis-side end of the base 4. Further, the resonating arm 5 extends from an end portion of the base 4 on one side in the X-axis direction, and the resonating arm 6 extends from an end portion on the other side in the X-axis direction. Each of the resonating arms 5 and 6 has an elongated shape and has a base end (+Y'-axis side end) that is a fixed end and a front end (−Y'-axis side end) that is a free end. The thus formed resonating arms 5 and 6 are configured in the same manner (in terms of shape and size).

The resonating arm 5 has a pair of front and rear principal surfaces 51 and 52 formed of XY' planes and facing away from each other and a pair of side surfaces 53 and 54 formed of Y'Z' planes and connect the pair of principal surfaces 51 and 52 to each other, as shown in FIG. 4. The resonating arm 5 further has a groove 55, which has a bottom and opens through the principal surface 51, and a groove 56, which has a bottom and opens through the principal surface 52. Each of the grooves 55 and 56 extends in the Y'-axis direction. The thus configured resonating arm 5 has a roughly H-like transverse cross-sectional shape in a portion where the grooves 55 and 56 are formed.

The grooves 55 and 56 are preferably formed symmetrically with respect to a line L, which halves the length of the resonating arm 5 in the thickness direction. The configuration described above can reduce the amount of unnecessary resonation of the resonating arm 5 (specifically, oblique resonation having out-of-plane component), whereby the resonating arm 5 is allowed to efficiently resonate in the in-plane direction of the resonation substrate 3.

As in the case of the resonating arm 5, the resonating arm 6 has a pair of front and rear principal surfaces 61 and 62 formed of XY' planes and facing away from each other and a pair of side surfaces 63 and 64 formed of Y'Z' planes and connect the pair of principal surfaces 61 and 62 to each other. The resonating arm 6 further has a groove 65, which has a bottom and opens through the principal surface 61, and a groove 66, which has a bottom and opens through the principal surface 62. Each of the grooves 65 and 66 extends in the Y'-axis direction. The thus configured resonating arm 6 has a roughly H-like transverse cross-sectional shape in a portion where the grooves 65 and 66 are formed.

The grooves 65 and 66 are preferably formed symmetrically with respect to the line L, which halves the length of the resonating arm 6 in the thickness direction. The configuration described above can reduce the amount of unnecessary resonation of the resonating arm 6, whereby the resonating arm 6 is allowed to efficiently resonate in the in-plane direction of the resonation substrate 3.

In the resonator element 2, forming the grooves 55, 56, 65 and 66 in the resonating arms 5 and 6 can reduce the amount of thermoelastic loss and hence provide an excellent resonation characteristic with degradation in Q value suppressed.

The resonating arm 5 has a pair of first drive electrodes 84 and a pair of second drive electrodes 85 formed thereon. Specifically, one of the first drive electrodes 84 is formed on the inner surface of the groove 55, and the other first drive electrode 84 is formed on the inner surface of the groove 56. One of the second drive electrodes 85 is formed on the side surface 53, and the other second drive electrode 85 is formed on the side surface 54. Similarly, the resonating arm 6 has a pair of first drive electrodes 84 and a pair of second drive electrodes 85 formed thereon. Specifically, one of the first drive electrodes 84 is formed on the side surface 63, and the other first drive electrode 84 is formed on the side surface 64. One of the second drive electrodes 85 is formed on the inner surface of the groove 65, and the other second drive electrode 85 is formed on the inner surface of the groove 66. When an alternating voltage is applied between the first drive electrodes 84 and the second drive electrodes 85, the resonating arms 5 and 6 resonate at a predetermined frequency in a plane (XY' plane) in such a way that they repeatedly approach each other and move away from each other. That is, the resonating arms 5 and 6 resonate in the direction indicated by the arrows a and b in FIG. 1.

Each of the first and second drive electrodes 84, 85 is not necessarily made of a specific material and can be made of gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), zirconium (Zr), or any other metal material, or indium tin oxide (ITO) or any other conductive material.

The resonation substrate 3 of the resonator element described above has a recessed portion and protruding portions in a plan view of the resonation substrate 3 (resonator element 2) (first principal surface 31), that is, when the resonation substrate 3 is viewed in the thickness direction thereof, as shown in FIGS. 1 and 5. In the plan view of the resonation substrate 3, for example, the resonating arms 5 and 6 are the protruding portions described above, and a valley portion between the resonating arms 5 and 6 is the recessed portion described above. The resonation substrate 3 has a first principal surface 31 and a second principal surface 32, which are front and rear surfaces facing away from each other, and a side surface 33, which is disposed between the first principal surface 31 and the second principal surface 32. The first principal surface 31 is a surface of the resonation substrate 3 on the reader's side of the plane of view of FIG. 1, the second principal surface 32 is a surface of the resonation substrate 3 on the opposite side of the plane of view of FIG. 1 to the reader's side, and the side surface 33 is a surface disposed between the first principal surface 31 and the second principal surface 32 and formed along the entire outer circumference of the resonation substrate 3.

The side surface 33 described above is formed of alternately disposed flat surfaces and curved surfaces. That is, the side surface 33 is formed of a flat surface 361, a curved surface 371, a flat surface 362, a curved surface 372, a flat surface 363, a curved surface 373, a flat surface 364, a curved surface 374, a flat surface 365, a curved surface 375, a flat surface 366, and a curved surface 376, and these surfaces are arranged in the order described above clockwise in FIGS. 1 and 5. In other words, the side surface 33 are configured as follows: The flat surface 361 and the flat surface 362 adjacent to each other are connected (linked) to each other via the curved surface 371; the flat surface 362 and the flat surface 363 adjacent to each other are connected to each other via the curved surface 372; the flat surface 363 and the flat surface 364 adjacent to each other are connected to each other via the curved surface 373; the flat surface 364 and the flat surface 365 adjacent to each other are connected to each other via the curved surface 374; the flat surface 365 and the flat surface 366 adjacent to each other are connected to each other via the curved surface 375; and the flat surface 366 and the flat surface 361 adjacent to each other are connected to each other via the curved surface 376.

Some of the curved surfaces 371 to 376 are concavely curved surface, and the others are convexly curved surfaces. Specifically, each of the curved surfaces 371, 374, 375, and 376 is a convexly curved surface. Among them, the curved surface 371 is provided as part of the side surface of a front end portion of the resonating arm 6 (protruding portion), the curved surface 374 is provided as part of the side surface of a front end portion of the resonating arm 5 (protruding portion), and the curved surfaces 375 and 376 are provided as part of the side surfaces of the protruding portions protruding from the base 4. Each of the curved surfaces 372 and 373 is a concavely curved surface, and the curved surfaces 372 and 373 are provided as part of the side surface of the valley portion 34 between the resonating arm 5 and the resonating arm 6. The side surface of the valley portion 34 described above has not only the curved surfaces 372 and 373 described above but also the flat surface 363 disposed between the curved surface 372 and the curved surface 373.

As described above, the resonator element 2 (resonator 1), in which the side surface 33 of the resonation substrate 3 is formed of the alternately arranged flat surfaces and curved surfaces, has no sharp corner, whereby stress concentration that occurs in a specific portion of the resonation substrate 3 can be suppressed, and durability of the resonation substrate 3 against impact can therefore be improved.

Since stress concentration that occurs in a specific portion of the resonation substrate 3 can be suppressed, no breakage of the resonating arms 5 and 6 occurs even when the amplitude thereof is increased, whereby the amplitude described above can be increased.

Moreover, since the resonating arms 5 and 6 can be provided with the curved surfaces in a stable manner, the Q value can be improved.

Further, since the side surface 33 has no sharp corner, the resonation substrate 3 can be manufactured in a stable shape and hence with precision, whereby the frequency characteristic of the resonation substrate 3 can be improved. Since the resonation substrate 3 can be manufactured with precision, for example, frequency fine adjustment made by laser processing or any other method is not required, whereby the number of manufacturing steps can be reduced.

Further, forming a specific portion having a curved surface shape provides the following advantageous effects.

First, providing the curved surfaces 371 and 374 as part of the side surfaces of the front end portions of the resonating arms 5 and 6 (protruding portions) to eliminate sharp corners allows the resonating arms 5 and 6 to be manufactured with precision, whereby a desired resonation characteristic is provided.

Further, providing the curved surfaces 375 and 376 as part of the side surfaces of the protruding portions protruding from the base 4 to eliminate sharp corners allows the base 4 to be manufactured with precision, whereby implementing the resonator element 2 in the package 9 can be performed with no chipping of the resonator element 2, no decrease in yield due to electrode short circuit resulting from implementation position shift, suppression of resonation leakage, and other advantageous effects. The provision of the curved surfaces is thus very advantageous.

When the side surface of the valley portion 34 (recessed portion) has a sharp corner, stress concentration occurs particularly at the sharp corner. Therefore, providing the curved surfaces 372 and 373 as part of the side surface of the valley portion 34 eliminates a sharp corner, whereby stress concentration that otherwise occurs can be suppressed, and durability of the resonator element 2 against impact can be significantly improved. Further, the Q value can be improved, and the amplitude of the resonating arms 5 and 6 can be increased.

In the plan view of the resonation substrate 3, the radius of curvature of the curve of each of the curved surfaces 371 to 376 is not limited to a specific value and is set as appropriate in accordance with a variety of conditions. Further, in the plan view of the resonation substrate 3, the radii of curvature of the curves of the curved surfaces 371 to 376 may differ from one another or may be equal to one another. Moreover, in the plan view of the resonation substrate 3, the curve of each of the curved surfaces 371 to 376 may have a fixed radius of curvature or may have a portion where the radius of curvature changes.

Preferable dimensions and conditions of the curved surfaces 371 to 376 will be described below, but theses dimensions and conditions are not necessarily employed as described above.

First, in the plan view of the resonation substrate 3, the curve of each of the curved surfaces 371 to 376 preferably has a portion where the radius of curvature is greater than or equal to 3 μm but smaller than or equal to 50 more preferably has a portion where the radius of curvature is greater than or equal to 5 μm but smaller than or equal to 35 μm.

When the radius of curvature described above is smaller than the lower limit described above, although depending on the other conditions, the durability against impact could lower. Further, even when the radius of curvature described above is set at a value greater than the upper limit described above, although depending on the other conditions, improvement in the effect of increasing the durability against impact is not expected.

In the plan view of the resonation substrate 3, the curve of each of the concavely curved surfaces, that is, the curved surfaces 372 and 373 preferably has a portion where the radius of curvature is greater than or equal to 5 μm but smaller than or equal to 50 μm, more preferably has a portion where the radius of curvature is greater than or equal to 10 μm but smaller than or equal to 35 μm.

When the radius of curvature described above is smaller than the lower limit described above, although depending on the other conditions, the durability against impact could lower. Further, even when the radius of curvature described above is set at a value greater than the upper limit described above, although depending on the other conditions, improvement in the effect of increasing the durability against impact is not expected.

In the plan view of the resonation substrate 3, the curve of each of the convexly curved surfaces, that is, the curved surfaces 371, 374, 375, and 376 preferably has a portion where the radius of curvature is greater than or equal to 3 μm but smaller than or equal to 30 μm, more preferably has a portion where the radius of curvature is greater than or equal to 5 μm but smaller than or equal to 15 μm.

When the radius of curvature described above is smaller than the lower limit described above, although depending on the other conditions, the resonation substrate 3 could not be manufactured with precision, and the durability against impact could lower. On the other hand, when the radius of curvature described above is greater than the upper limit described above, for example, the volume of the front end portion of each of the resonating arms 5 and 6 decreases, and the resonating arms 5 and 6 cannot therefore be shortened, which is disadvantageous in size reduction of the resonator element 2. Further, even when the radius of curvature described above is set at a value greater than the upper limit described above, although depending on the other conditions, improvement in the effect of increasing the durability against impact is not expected.

In the plan view of the resonation substrate 3, the average radius of curvature of the curve of each of the curved surfaces 372 and 373, which are concavely curved surfaces, is preferably greater than the average radius of curvature of the curve of each of the curved surfaces 371, 374, 375, and 376, which are convexly curved surfaces. For example, setting the average radius of curvature of the curve of each of the curved surfaces 372 and 373 to be greater than the average radius of curvature of the curve of each of the curved surfaces 371 and 374 allows the volume of the front end portion of each of the resonating arms 5 and 6. As a result, the resonating arms 5 and 6 can be shortened, whereby the size of the resonator element 2 can be reduced. The average radius of curvature described above is not the average of the radii of curvature of the curves of a plurality of curved surfaces but is the average of the radii of curvature of the curve of a single curved surface.

In the present embodiment, the description has been made of the case where the resonation substrate 3 is a Z-cut quartz crystal substrate, and the invention is also applicable to a quartz crystal substrate cut in any other way, that is, for example, an AT-cut quartz crystal substrate, an X-cut quartz crystal substrate, and an SC-cut quartz crystal substrate.

Package

The package 9 has a box-shaped base 91, which has a recess 911 that opens upward, and a plate-shaped lid 92, which is so bonded to the base 91 that the lid 92 closes the opening of the recess 911, as shown in FIGS. 1 and 3. The thus configured package 9 has an accommodation space formed when the lid 92 closes the recess 911, and the accommodation space hermetically accommodates the resonator element 2. The resonator element 2, specifically, end portions of the base 4 on the opposite sides in the X-axis direction are fixed to the bottom surface of the recess 911 via a conductive adhesive 11 and 13, which is, for example, a mixture of an epoxy-based or acryl-based resin and conductive fillers.

The accommodation space may have a reduced pressure (is preferably maintained under vacuum) or maybe filled with nitrogen, helium, argon, or any other inert gas. The resonation characteristic of the resonator element 2 can thus be improved.

The base 91 is not necessarily made of a specific material and can be made of an aluminum oxide or any of a variety of other ceramics. The lid 92 is not necessarily made of a specific material and is preferably formed of a member having a coefficient of linear expansion close to that of the material of which the base 91 is made. For example, when the material of which the base 91 is made is any of the ceramics described above, the lid 92 is preferably made of Kovar or any other alloy. How to bond the base 91 and the lid 92 to each other is not limited to a specific method, and they can be bonded to each other, for example, via an adhesive, by using seam welding, or in any other process.

Connection terminals 951 and 961 are formed on the bottom surface of the recess 911 of the base 91. Although not shown, the first drive electrodes 84 in the resonator element 2 are drawn to the base 4 and electrically connected there to the connection terminal 951 via the conductive adhesive 11. Similarly, although not shown, the second drive electrodes 85 in the resonator element 2 are drawn to the base 4 and electrically connected there to the connection terminal 961 via the conductive adhesive 13.

The connection terminal 951 is electrically connected to an outer terminal 953, which is formed on the bottom surface of the base 91, via a pass-through electrode 952, which passes through the base 91, and the connection terminal 961 is electrically connected to an outer terminal 963, which is formed on the bottom surface of the base 91, via a pass-through electrode 962, which passes through the base 91.

Each of the connection terminals 951 and 961, the pass-through electrodes 952 and 962, and the outer terminals 953 and 963 is not necessarily configured in a specific manner as long as it is conductive, and can, for example, be formed of a metal coating produced by layering a Ni (nickel) coating, an Au (gold) coating, an Ag (silver) coating, a Cu (copper) coating, or any other coating on a metalized layer (undercoat layer) made, for example, of Cr (chromium) or W (tungsten).

Method for Manufacturing Resonator Element

A method for manufacturing the resonator element 2 (resonation substrate 3) will next be described with reference to FIGS. 6A to 6D to FIGS. 8A to 8D.

A method for manufacturing the resonator element 2 includes the step of providing a quartz crystal substrate (substrate) 30, the step of forming a mask on the quartz crystal substrate 30, and the step of forming the resonation substrate (structural body) 3, which has the side surface 33 disposed between the first principal surface 31 and the second principal surface 32 and formed of the alternately arranged flat surfaces and curved surfaces and includes the recessed portion and the protruding portions in a plan view of the resonation substrate 3 (resonator element 2). A detailed description will be made below.

The quartz crystal substrate 30, which is a Z-cut quartz crystal plate, is first provided (see FIG. 6A). The quartz crystal substrate 30 is a member that is processed as will be described later to form the resonation substrate 3. A mask M1 is then formed on the upper surface of the quartz crystal substrate 30, for example, by using photolithography, as shown in FIGS. 6A and 6B. The mask M1 is a mask formed in correspondence with the outer shape of the resonation substrate 3.

Dry etching is then performed on the quartz crystal substrate 30 via (by using) the mask M1, as shown in FIGS. 6C and 6D. The dry etching is performed in the direction perpendicular to (intersecting) the resonation direction of the resonator element 2. As a result, the resonation substrate 3 having the resonating arms 5 and 6 with no groove 55, 56, 65, or 66 formed therein and the base 4 is formed.

The mask M1 is then removed, as shown in FIGS. 7A and 7B.

A mask M2 is then formed on the upper surface of the quartz crystal substrate 30, for example, by using photolithography, as shown in FIG. 7C. The mask M2 is a mask formed in correspondence with the outer shapes of the groove 55 in the resonating arm 5 and the groove 65 in the resonating arm 6. In this process, the mask M2 is formed on a portion where the groove 55 or 65 is not formed.

Dry etching is then performed on the quartz crystal substrate 30 via the mask M2, as shown in FIG. 7D. As a result, the groove 55 is formed in the resonating arm 5, the groove 65 is formed in the resonating arm 6, and the resonation substrate 3 having the resonating arms 5 and 6 with no groove 56 or 66 formed therein and the base 4 is formed.

Figure 8A:
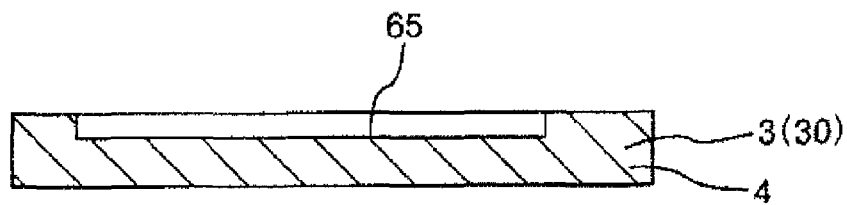
FIGS. 8A to 8D describe the method for manufacturing the resonator element of the resonator shown in FIG. 1.

The mask M2 is then removed, as shown in FIG. 8A.

Figure 8B:
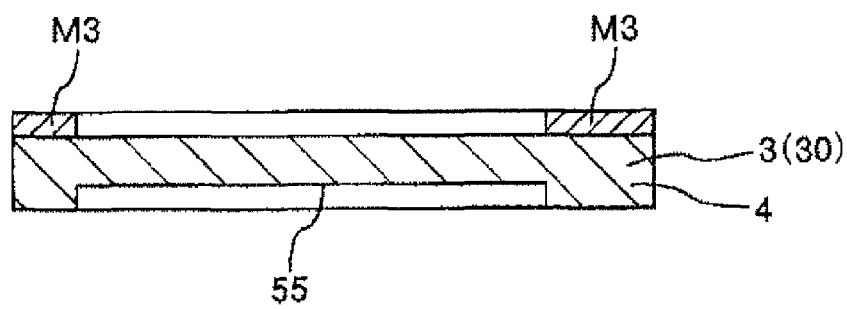

The quartz crystal substrate 30 is then turned upside down, and a mask M3 is formed on the upper surface of the quartz crystal substrate 30, for example, by using photolithography, as shown in FIG. 8B. The mask M3 is a mask formed in correspondence with the outer shapes of the groove 56 in the resonating arm 5 and the groove 66 in the resonating arm 6. In this process, the mask M3 is formed on a portion where the groove 56 or 66 is not formed.

Figure 8C:
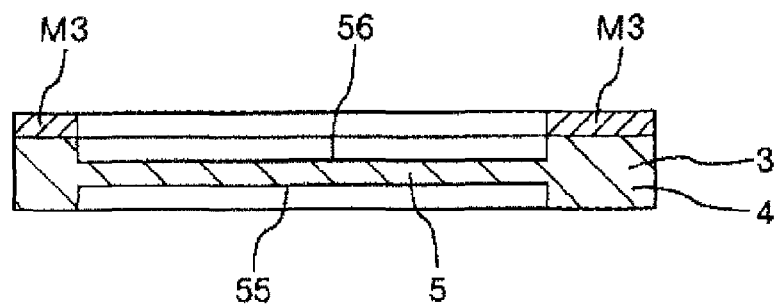

Dry etching is then performed on the quartz crystal substrate 30 via the mask M3, as shown in FIG. 8C. As a result, the groove 56 is formed in the resonating arm 5, the groove 66 is formed in the resonating arm 6, and the resonation substrate 3 having the resonating arms 5 and 6 with the grooves 55, 56, 65, and 66 formed therein and the base 4 is formed.

Figure 8D:
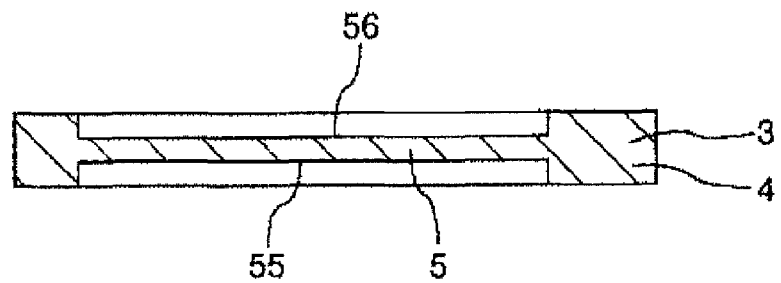

The mask M3 is then removed, as shown in FIG. 8D. The resonation substrate 3 is thus produced.

A metal film that is not shown is then formed on the front surface of the resonation substrate 3, for example, in an evaporation process. The metal film described above is then patterned, for example, through a mask that is not shown to form the first and second drive electrodes 84, 85. The resonator element 2 is thus produced.

According to the manufacturing method described above, the resonator element 2 that excels in durability against impact can be readily manufactured.

That is, using dry etching instead of wet etching allows the flat surfaces and the curved surfaces as the side surface of the resonation substrate 3 to be formed readily with precision irrespective of crystal anisotropy and other factors of the quartz crystal substrate 30. Since the side surface of the resonation substrate 3 has no sharp corner, light diffraction can be suppressed when photolithography is used, whereby the resonation substrate 3 can be formed with precision.

As described above, according to the resonator 1 (resonator element 2), durability thereof against impact due, for example, to falling can be improved.

In the present embodiment, the case where one of the masks M1 and M2 is formed on one surface and the other mask is then formed on the other surface is presented. The two surfaces may instead be exposed to light simultaneously by using photolithography to form the masks. Exposing the two surfaces simultaneously to light allows the amount of positional shift between the mask M1 and the mask M2 to be reduced.

The number of resonating arms is two in the present embodiment. The number of resonating arms is not necessarily two and can, for example, be one or three or more.

The front end portion of each of the resonating arms may be provided with a hammer head (weight). Providing a hammer head allows each of the resonating arms to be shortened and the size of the resonator element 2 to be reduced accordingly.

The resonating arms 5 and 6 are not necessarily parallel to each other, and the grooves 55, 56, 65, and 66 may, of course, be omitted.

Second Embodiment

Figure 9:
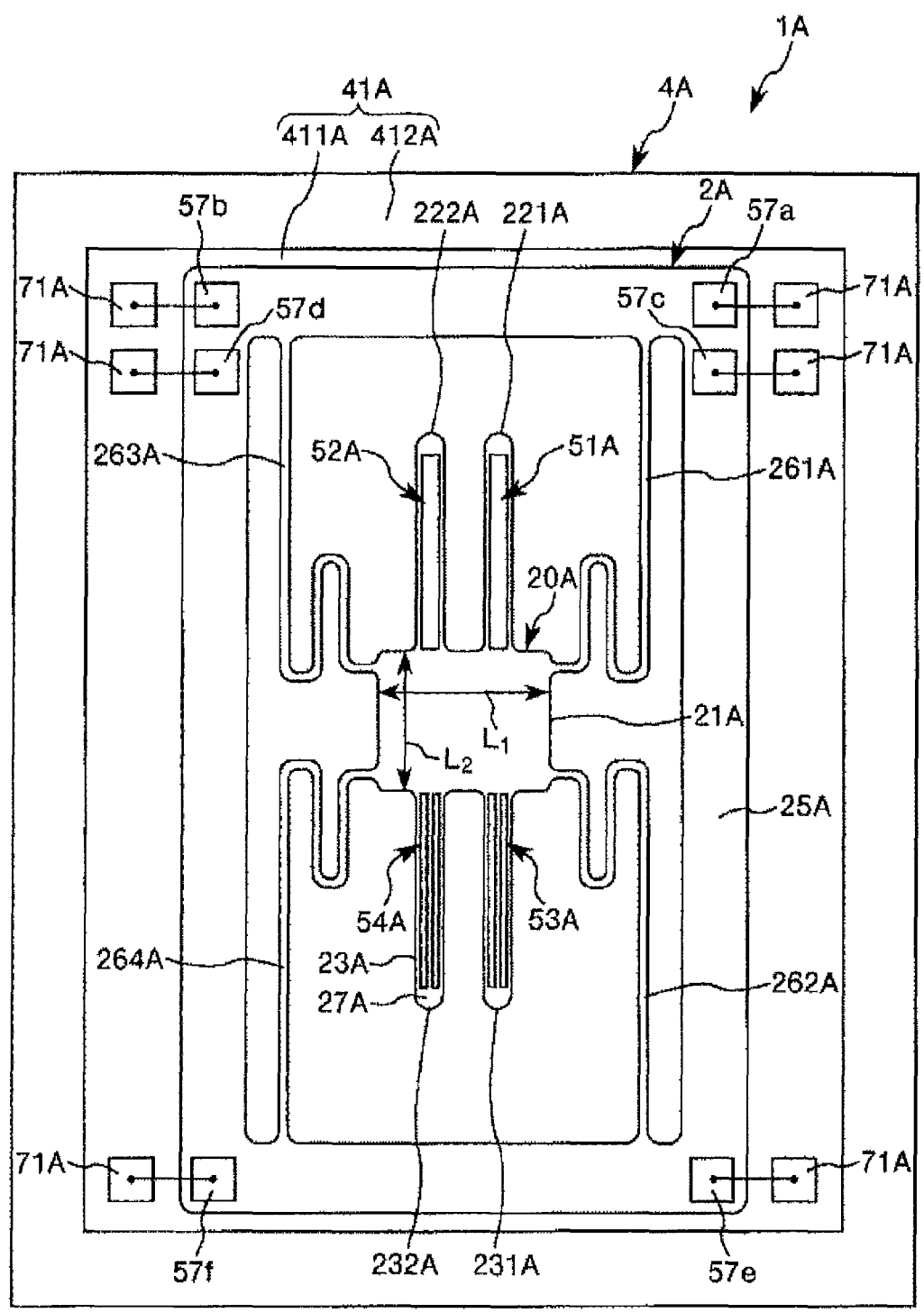
FIG. 9 is a plan view showing a resonator according to a second embodiment of the invention.
Figure 11A:
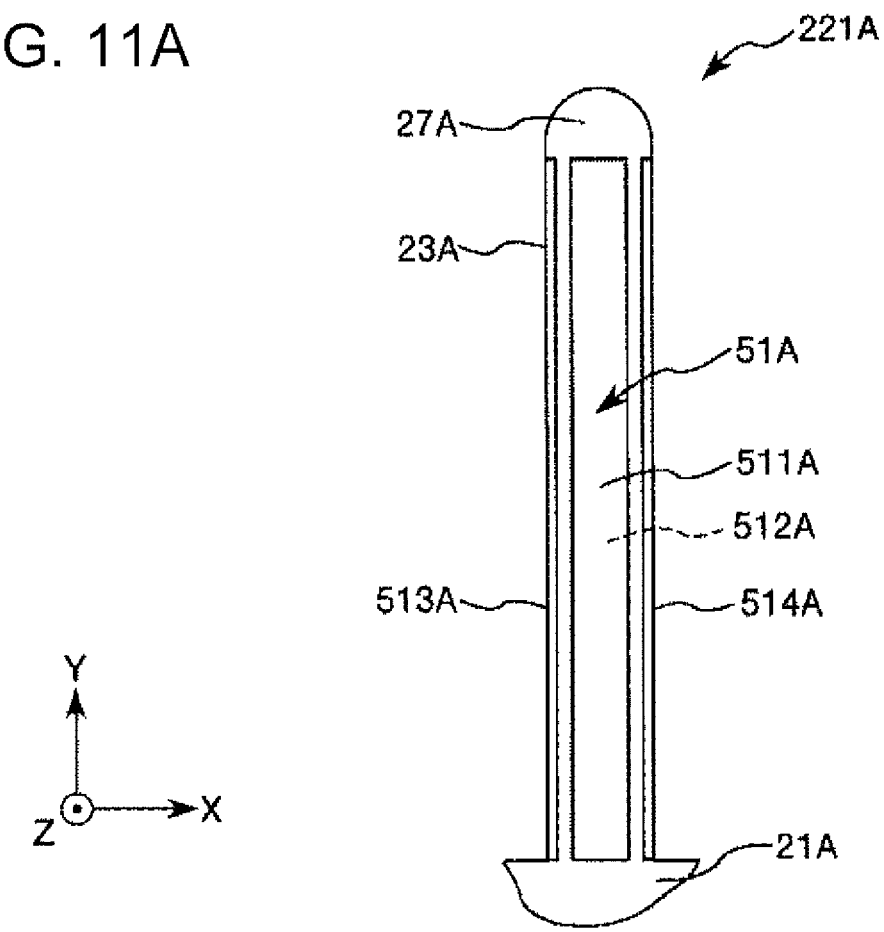
FIGS. 11A and 11B show a drive resonating arm of the resonator shown in FIG. 9.
Figure 11B:
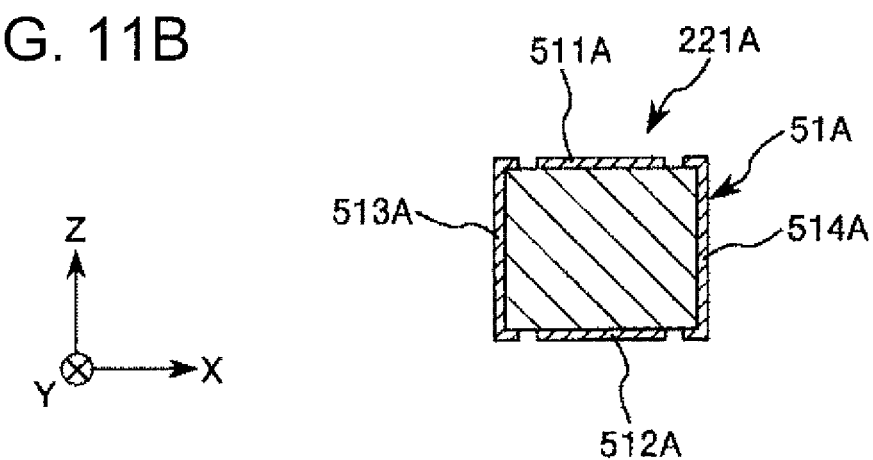
Figure 12A:
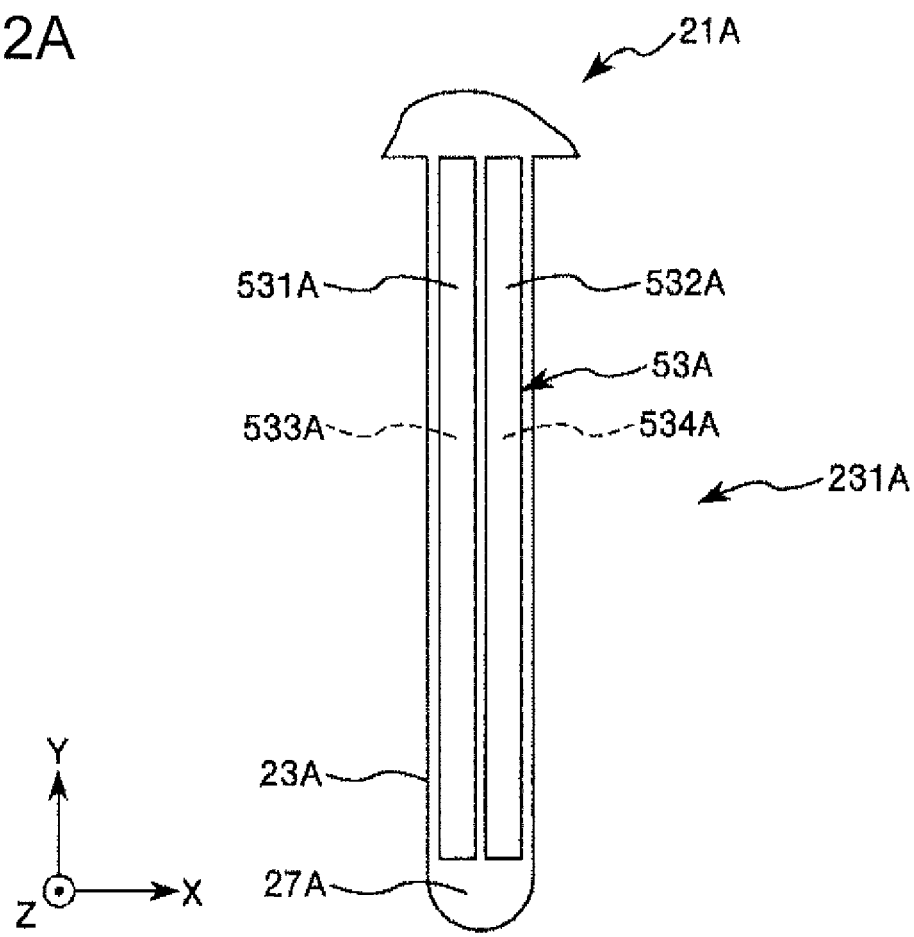
FIGS. 12A and 12B show a detection resonating arm of the resonator shown in FIG. 9.
Figure 12B:
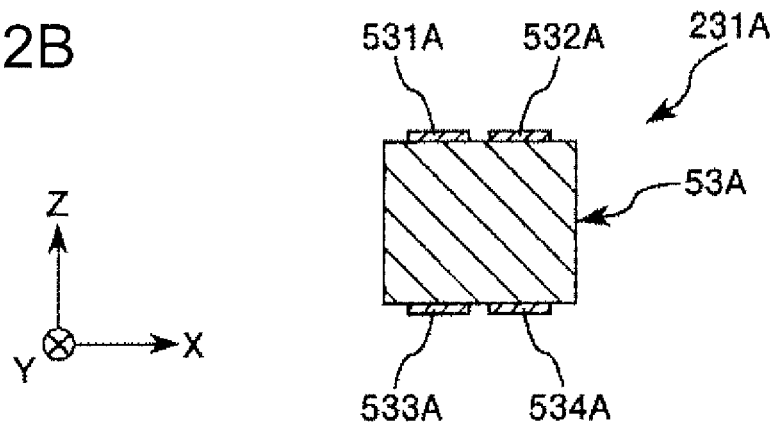
Figure 13:
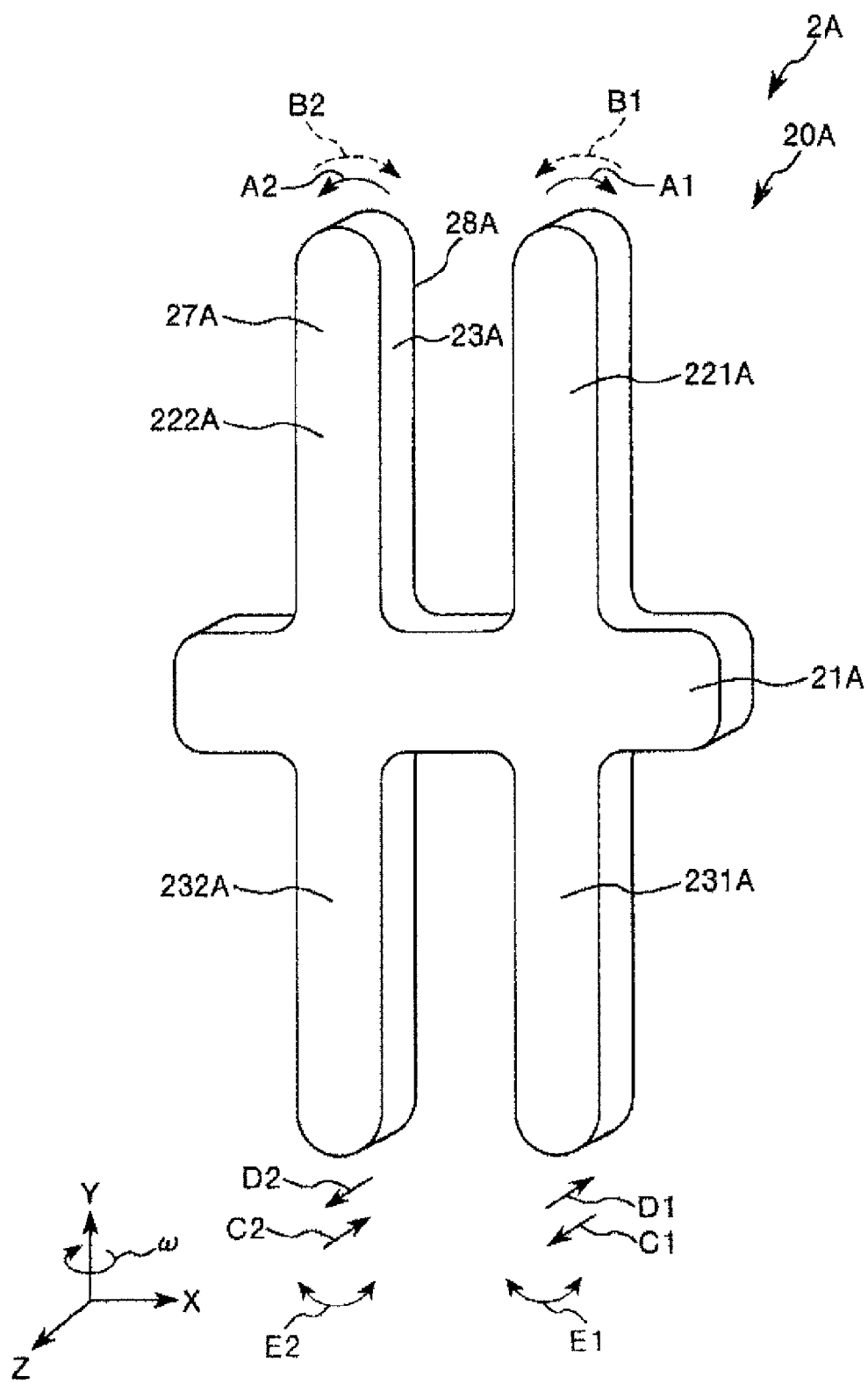
FIG. 13 is a perspective view of a key portion of a resonator element of the resonator shown in FIG. 9.
Figure 14:
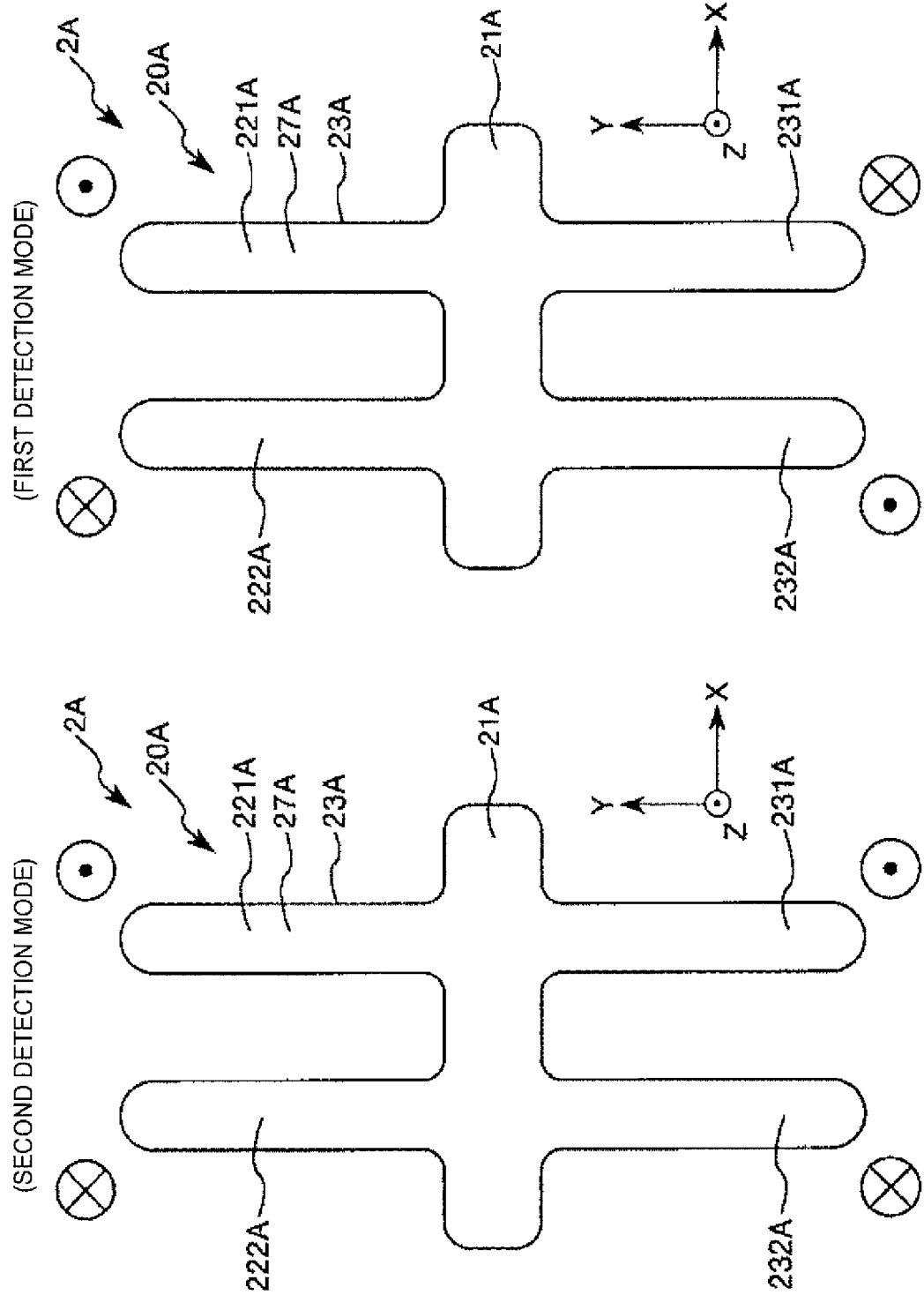
FIGS. 14A and 14B describe detection modes of the resonator element of the resonator shown in FIG. 9.

FIG. 9 is a plan view showing an resonator according to a second embodiment of the invention. FIG. 10 is a transverse cross-sectional view of the resonator shown in FIG. 9. FIGS. 11A and 11B show a drive resonating arm of the resonator shown in FIG. 9. FIG. 11A is an enlarged plan view, and FIG. 11B is an enlarged transverse cross-sectional view. FIGS. 12A and 12B show a detection resonating arm of the resonator shown in FIG. 9. FIG. 12A is an enlarged plan view, and FIG. 12B is an enlarged transverse cross-sectional view. FIG. 13 is a perspective view of a key portion of a resonator element of the resonator shown in FIG. 9. FIGS. 14A and 14B describe detection modes of the resonator element of the resonator shown in FIG. 9.

In the following description, as three axes perpendicular to each other (intersecting each other), an x axis (first axis), a y axis (second axis), and a z axis (third axis) are assumed for ease of description. FIGS. 9 to 13 are drawn based on the axes described above with the direction parallel to the x axis called an "x-axis direction," the direction parallel to the y axis called a "y-axis direction," and the direction parallel to the z axis called a "z-axis direction." Further, the positive and negative signs in each of the directions are indicated by the arrows in FIGS. 9 to 13.

In the following description, the second embodiment will be described primarily about items different from those in the first embodiment described above, and the same items as those in the first embodiment will not be described.

A resonator 1A shown in FIGS. 9 and 10 is a gyro sensor that detects angular velocity.

The resonator 1A can be used, for example, in handshaking correction in an imaging apparatus, attitude detection, attitude control, and other types of operation in a vehicle in a moving object navigation system using GPS (global positioning system) satellite signals.

The resonator 1A includes a resonator element 2A and a package 4A, which accommodates the resonator element 2A.

The portions that form the resonator 1A will be sequentially described below.

The resonator element 2A is a gyro sensor device that detects angular velocity around one axis.

The resonator element 2A, in which the z axis is a normal thereto, includes an resonation substrate 20A, drive electrode groups 51A and 52A, and detection electrode groups 53A and 54A as shown in FIG. 9.

The resonation substrate 20A is what is called an "H-shaped" resonation substrate having a base 21A, a pair of drive resonating arms (resonating arms) 221A and 222A, a pair of detection resonating arms (resonating arms) 231A and 232A, a support portion 25A, and four linkage portions 261A, 262A, 263A, and 264A. In the present embodiment, the base 21A, the drive resonating arms 221A and 222A, the detection resonating arms 231A and 232A, the support portion 25A, and the linkage portions 261A to 264A are made of a piezoelectric material and formed integrally with one another. The detection resonating arm 231A is a first detection resonating arm, and the detection resonating arm 232A is a second detection resonating arm.

The piezoelectric material is not limited to a specific material and is preferably quartz crystal, which can ensure excellent characteristics of the resonator element 2A. Quartz crystal has the following three crystal axes perpendicular to each other: an X axis (electrical axis); a Y axis (mechanical axis); and a Z axis (optical axis). The base 21A, the drive resonating arms 221A and 222A, the detection resonating arms 231A and 232A, the support portion 25A, and the linkage portions 261A to 264A can be formed, for example, by etching a substrate made of quartz crystal, having plate surfaces parallel to the X and the Y axes, and having a thickness the direction of which coincides with the Z axis. The thickness of the substrate is set as appropriate in accordance, for example, with the resonation frequency (resonance frequency), the size of the exterior shape, and the processability of the resonator element 2A. In the present embodiment, the description will be made of a case where the base 21A, the drive resonating arms 221A and 222A, the detection resonating arms 231A and 232A, the support portion 25A, and the linkage portions 261A to 264A are made of quartz crystal and formed integrally with one another. Further, in the present embodiment, the crystal axis X coincides with the absolute coordinate axis x, the crystal axis Y coincides with the absolute coordinate axis y, and the crystal axis Z coincides with the absolute coordinate axis z.

The base 21A is supported by the support portion 25A, which is so formed that it surrounds the base 21A in a plan view, via the four linkage portions 261A to 264A. Each of the linkage portions 261A to 264A has an elongated shape and has one end linked to the base 21A and the other end linked to the support portion 25A. Each of the linkage portions 261A to 264A is bent multiple times halfway in the longitudinal direction.

The base 21A has a rectangular shape when viewed in the z-axis direction with a pair of sides extending in the y-axis direction and a pair of side extending in the x-axis direction. That is, the base 21A has a rectangular shape in a plan view with a pair of sides parallel to the direction in which the drive resonating arms 221A and 222A, which will be described later, extend and a pair of sides perpendicular to the direction in which the drive resonating arms 221A and 222A extend. The detection resonating arms 231A and 232A are therefore allowed to efficiently resonate in the first direction (direction indicated by arrows E1 and E2 shown in FIG. 13) (in-plane resonation) when the drive resonating arms 221A and 222A undergo drive resonation (see FIG. 13), as will be described later.

Further, the rectangular shape of the base 21A in the present embodiment preferably has the length in the x-axis direction greater than the length in the y-axis direction, as shown in FIG. 9. That is, $L1 > L2$ is preferably satisfied, where L1 is the length of the base 21A in the direction perpendicular to the direction in which the drive resonating arms 221A and 222A extend in a plan view, and L2 is the length of the base 21A in the direction parallel to the direction in which the drive resonating arms 221A and 222A extend in the plan view. When the relationship between L1 and L2 described above is satisfied, the detection resonating arms 231A and 232A are allowed to more efficiently resonate in the second direction E1, E2 when the drive resonating arms 221A and 222A undergo drive resonation.

Each of the drive resonating arms 221A and 222A extends from the base 21A in the y-axis direction (+y direction). The drive resonating arms 221A and 222A are therefore so provided that they are parallel to each other. Further, the drive resonating arms 221A and 222A are so arranged that they are separate from each other in the x-axis direction. As a result, the drive resonating arms 221A and 222A can resonate independently of each other. The transverse cross-sectional shape of each of the drive resonating arms 221A and 222A has a rectangular shape formed of a pair of sides parallel to the x axis and a pair of sides parallel to the z axis, as shown in FIG. 11B.

The drive resonating arm 221A is provided with the drive electrode group 51A, and the drive resonating arm 222A is similarly provided with the drive electrode group 52A. The drive electrode group 51A will be representatively described below. The drive electrode group 52A is formed of four drive electrodes and has the same configuration as that of the drive electrode group 51A, which will be described later. The drive electrode group 52A is therefore not described. Predetermined electrodes in the drive electrode group 51A and the drive electrode group 52A are electrically connected to each other via wiring lines that are not shown.

The drive electrode group 51A is formed of a drive electrode 511A, which is provided on the upper surface of the drive resonating arm 221A, a drive electrode 512A, which is provided on the lower surface of the drive resonating arm 221A, a drive electrode 513A, which is provided on the left side surface of the drive resonating arm 221A, and a drive electrode 514A, which is provided on the right side surface of the drive resonating arm 221A, as shown in FIGS. 11A and 11B.

The drive electrode 511A and the drive electrode 512A are electrically connected to each other via a wiring line that is not shown so that they have the same potential. Similarly, the drive electrode 513A and the drive electrode 514A are electrically connected to each other via a wiring line that is not shown so that they have the same potential. The thus connected drive electrodes 511A and 512A are electrically connected to a terminal 57a, which is provided on the support portion 25A shown in FIG. 9, via a wiring line that is not shown. Similarly, the drive electrodes 513A and 514A are electrically connected to a terminal 57b, which is provided on the support portion 25A shown in FIG. 9, via a wiring line that is not shown. Predetermined drive electrodes in the drive electrode group 52A are electrically connected to the drive electrodes 513A and 514A, and predetermined drive electrodes in the drive electrode group 52A are electrically connected to the drive electrodes 511A and 512A.

Each of the detection resonating arms 231A and 232A extends from the base 21A in the y-axis direction (−y direction). The detection resonating arms 231A and 232A are therefore so provided that they are parallel to each other. Further, the detection resonating arms 231A and 232A extend in the direction opposite the direction in which the drive resonating arms 221A and 222A described above extend. Moreover, the detection resonating arms 231A and 232A are so arranged that they are separate from each other in the x-axis direction. As a result, the detection resonating arms 231A and 232A can resonate independently of each other. The transverse cross-sectional shape of each of the detection resonating arms 231A and 232A has a rectangular shape formed of a pair of sides parallel to the x axis and a pair of sides parallel to the z axis, as shown in FIG. 12B. The detection resonating arm 231A and the drive resonating arm 221A are coaxially arranged, and the positions thereof in the x-axis and z-axis directions coincide with each other. Similarly, the detection resonating arm 232A and the drive resonating arm 222A are coaxially arranged, and the positions thereof in the x-axis and z-axis directions coincide with each other.

The thus configured detection resonating arms 231A and 232A resonate not only in the third direction (arrows C1 and D1 and arrows C2 and D2 shown in FIG. 13) in accordance with a physical quantity acting on the drive resonating arms 221A and 222A, as will be described later, but also in the first direction (arrows E1 and E2 shown in FIG. 13), which differs from the third direction when the drive resonating arms 221A and 222A undergo drive resonation.

The detection resonating arm 231A is provided with the detection electrode group 53A, and the detection resonating arm 232A is similarly provided with the detection electrode group 54A, as shown in FIG. 9. Providing the detection electrode groups 53A and 54A on the detection resonating arms 231A and 232A, which are provided separately from the drive resonating arms 221A and 222A, as described above allows the electrode area (area of portions that function as electrodes) of detection electrodes of the detection electrode groups 53A and 54A to be increased. The detection sensitivity of the resonator element 2A can therefore be improved.

The detection electrode group 53A will be representatively described below. The detection electrode group 54A is formed of four detection electrodes and has the same configuration as that of the detection electrode group 53A, which will be described later. The detection electrode group 54A is therefore not described.

The detection electrode group 53A is formed of detection electrodes (first detection electrodes) 531A and 532A, which are provided on the upper surface of the detection resonating arm 231A, and detection electrodes (second detection electrodes) 533A and 534A, which are provided on the lower surface of the detection resonating arm 231A, as shown in FIGS. 12A and 122. The detection electrodes 531A and 533A are provided on one side of the detection resonating arm 231A in the width direction (left in FIGS. 12A and 12B), and the detection electrodes 532A and 534A are provided on the other side of the detection resonating arm 231A in the width direction (right in FIGS. 12A and 12B).

The detection electrode 531A and the detection electrode 534A are electrically connected to each other via a wiring line that is not shown so that they have the same potential. Similarly, the detection electrode 532A and the detection electrode 533A are electrically connected to each other via a wiring line that is not shown so that they have the same potential. The thus connected detection electrodes 531A and 534A are electrically connected to a terminal 57c, which is provided on the support portion 25A shown in FIG. 9, via a wiring line that is not shown. Similarly, the detection electrodes 532A and 533A are electrically connected to a terminal 57e, which is provided on the support portion 25A shown in FIG. 9, via a wiring line that is not shown. The detection electrode group 54A is electrically connected to terminals 57d and 57f, which are provided on the support portion 25A shown in FIG. 9, via wiring lines that are not shown.

In the thus configured resonator element 2A, when it is used, a drive signal (drive voltage) is applied between the terminal 57a and the terminal 57b, that is, current is conducted through the drive electrode groups 51A and 52A to cause the drive resonating arms 221A and 222A to undergo bending resonation (drive resonation) (reciprocating motion in x-axis direction) in such a way that they approach each other and move away from each other, as shown in FIG. 13. That is, a state in which the drive resonating arm 221A bends in the direction indicated by the arrow A1 in FIG. 13 and the drive resonating arm 222A bends in the direction indicated by the arrow A2 in FIG. 13 and a state in which the drive resonating arm 221A bends in the direction indicated by the arrow B1 in FIG. 13 and the drive resonating arm 222A bends in the direction indicated by the arrow B2 in FIG. 13 are alternately repeated. The two states occur in a drive mode.

When angular velocity ω around the y axis acts on the resonator element 2A in the state in which the drive resonating arms 221A and 222A undergo the drive resonation as described above, the drive resonating arms 221A and 222A undergo bending resonation in opposite directions along the z-axis direction due to Coriolis force (reciprocating motion in z-axis direction). In response to the bending resonation, the detection resonating arms 231A and 232A undergo bending resonation (detection resonation) in opposite directions along the z-axis direction (third direction) (reciprocating motion in z-axis direction). That is, a state in which the drive resonating arm 221A bends in the direction indicated by the arrow C1 in FIG. 13 and the drive resonating arm 222A bends in the direction indicated by, the arrow C2 in FIG. 13 and a state in which the detection resonating arm 231A bends in the direction indicated by the arrow D1 or D2 in FIG. 13 and the detection resonating arm 232A bends in the direction indicated by the arrow D2 or D1 in FIG. 13 are alternately repeated. The two states occur in a detection mode.

Detecting electric charge produced in the detection electrode groups 53A and 54A when the detection resonating arms 231A and 232A undergo the detection resonation allows determination of the angular velocity ω acting on the resonator element 2A.

The detection mode described above includes a first detection mode shown in FIG. 14A and a second detection mode shown in FIG. 14B. The first detection mode and the second detection mode differ from each other in terms of resonance frequency of the detection resonation of the detection resonating arms 231A and 232A.

In the first detection mode shown in FIG. 14A, the drive resonating arm 221A and the detection resonating arm 231A, which are coaxially arranged, resonate in opposite directions along the z-axis direction, and the drive resonating arm 222A and the detection resonating arm 232A, which are coaxially arranged, similarly resonate in opposite directions along the z-axis direction.

In the second detection mode shown in FIG. 14B, the drive resonating arm 221A and the detection resonating arm 231A, which are coaxially arranged, resonate in the same direction along the z-axis direction, and the drive resonating arm 222A and the detection resonating arm 232A, which are coaxially arranged, similarly resonate in the same direction along the z-axis direction.

Each of the reference characters "●" and "x" in FIGS. 14A and 14B denotes the direction of displacement in the resonation of the corresponding one of the drive resonating arms 221A and 222A and the detection resonating arms 231A and 232A. The reference character "●" denotes the displacement direction from the rear side toward the front side of the plane of view of FIGS. 14A and 14B, and the reference character "x" denotes the displacement direction from the front side toward the rear side of the plane of view of FIGS. 14A and 14B.

In the resonator element 2A described above, a side surface 23A, which is disposed between a first principal surface 27A and a second principal surface 28A of the resonation substrate (structural body) 20A, is formed of alternately arranged flat surfaces and curved surfaces, as in the first embodiment, as in the first embodiment. As a result, the durability of the resonator element 2A against impact due, for example, to falling thereof can be improved, and the other same advantageous effects as those provided by the first embodiment described above are provided.

The package 4A has a base member (base) 41A, which has a recess that opens upward, and a lid member (lid) 42A, which is so provided that it covers the recess of the based member 41A, as shown in FIG. 10. The base member 41A and the lid member 42A form an internal space that accommodates the resonator element 2A.

The base member 41A is formed of a flat-plate-shaped plate body (plate portion) 411A and a frame body (frame portion) 412A, which is bonded to an outer circumferential portion of the upper surface of the plate body 411A.

The thus configured base member 41A is made, for example, of an aluminum-oxide-based sintered body, quartz crystal, or glass.

The support portion 25A of the resonator element 2A described above is bonded to the upper surface of the plate body 411A of the base member 41A (surface facing the side covered with the lid member 42A) via a bonding member 81A, such as an adhesive containing a silicon resin, an epoxy resin, an acrylic resin, or any other resin material, as shown in FIG. 10. The resonator element 2A is thus supported by and fixed to the base member 41A.

Further, a plurality of internal terminals 71A are provided on the upper surface of the base member 41A, as shown in FIGS. 9 and 10.

The terminals 57a to 57f on the resonator element 2A described above are electrically connected to the plurality of internal terminals 71A via wiring lines formed, for example, of bonding wires.

On the other hand, a plurality of external terminals 73A, which are used when the resonator 1A is implemented in an apparatus (external apparatus) into which the resonator 1A is incorporated, are provided on the lower surface of the plate body 411A of the base member 41A (bottom surface of package 4A).

The plurality of external terminals 73A are electrically connected to the plate body 411A via internal wiring lines that are not shown. The plate body 411A and the plurality of external terminals 73A are thus electrically connected to each other.

Each of the internal terminals 71A and the external terminals 73A is formed, for example, of a metal coating having a metalized layer made, for example, of tungsten (W) on which a coating made, for example, of nickel (Ni) or gold (Au) is plated or otherwise layered.

The lid member 42A is hermetically bonded to the thus configured base member 41A. The package 4A thus has a hermetically sealed inner space.

The lid member 42A is made, for example, of the same material as that of the base member 41A or Kovar, a 42-alloy, stainless steel, or any other metal.

A method for bonding the base member 41A and the lid member 42A to each other is not limited to a specific method and can, for example, be a bonding method based on an adhesive made, for example, of a brazing material or a curable resin or a welding method based, for example, on seam welding or laser welding. Further, the welding can be performed under reduced pressure or in an inert gas atmosphere so that the internal space in the package 4A is held in a reduced pressure state or an inert gas sealed state.

According to the resonator 1A, the same advantageous effects as those provided by the first embodiment described above are provided.

Further, in the resonator 1A, improvement in the Q value not only allows the drive resonating arms 221A and 222A to resonate by a large amount at a low voltage but also prevents breakage of the drive resonating arms 221A and 222A and the detection resonating arms 231A and 232A even when the amplitude thereof is increased, whereby the amplitude of the drive resonating arms 221A and 222A and the detection resonating arms 231A and 232A can be increased, and the sensitivity can be improved accordingly.

Third Embodiment

Figure 15:
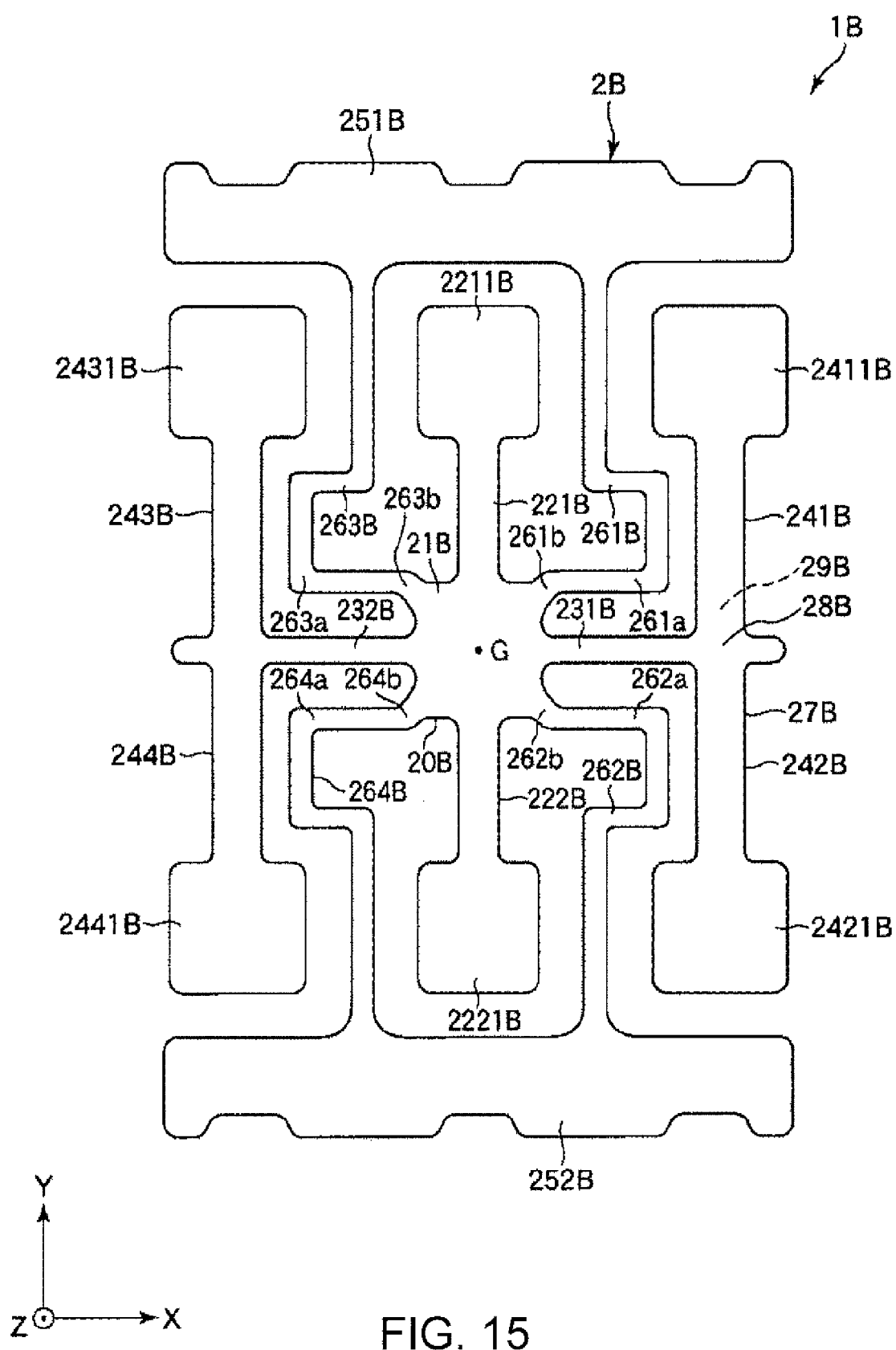
FIG. 15 is a plan view showing a resonator element of an resonator according to a third embodiment of the invention.
Figure 16:
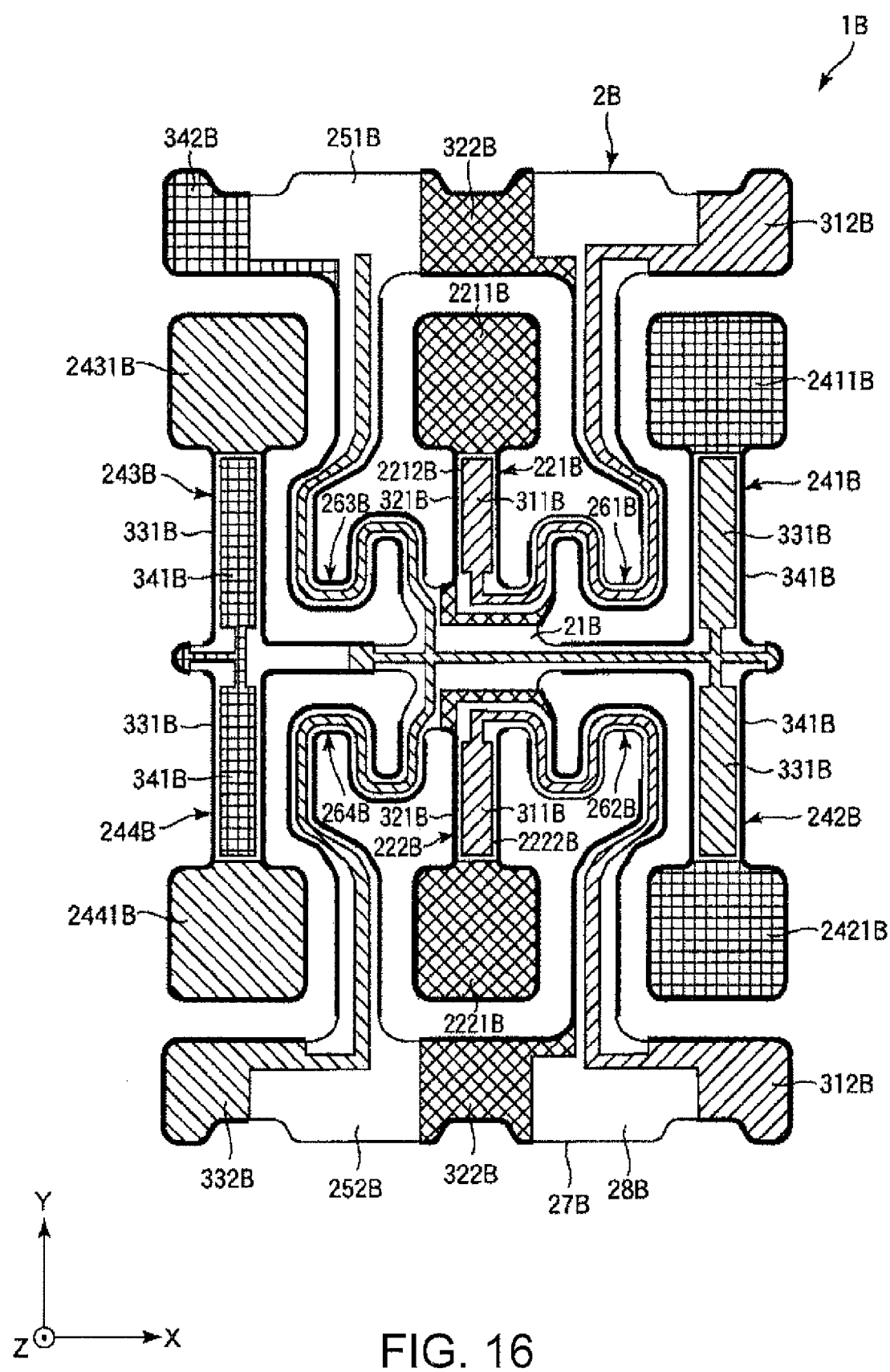
FIG. 16 is a plan view showing electrodes provided on the resonator element shown in FIG. 15.
Figure 17:
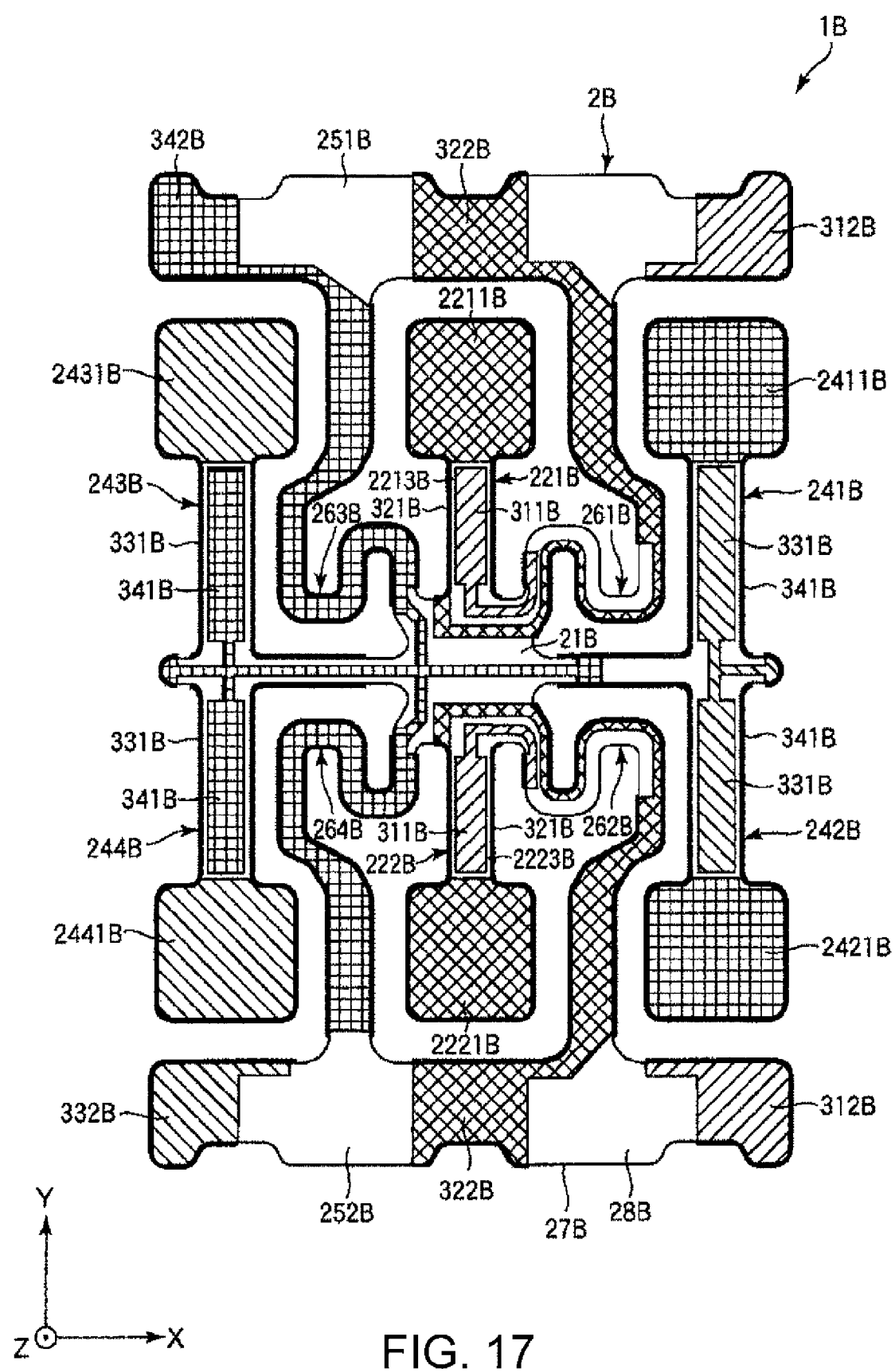
FIG. 17 is a plan view (see-through view) showing the electrodes provided on the resonator element shown in FIG. 15.
Figure 18A:
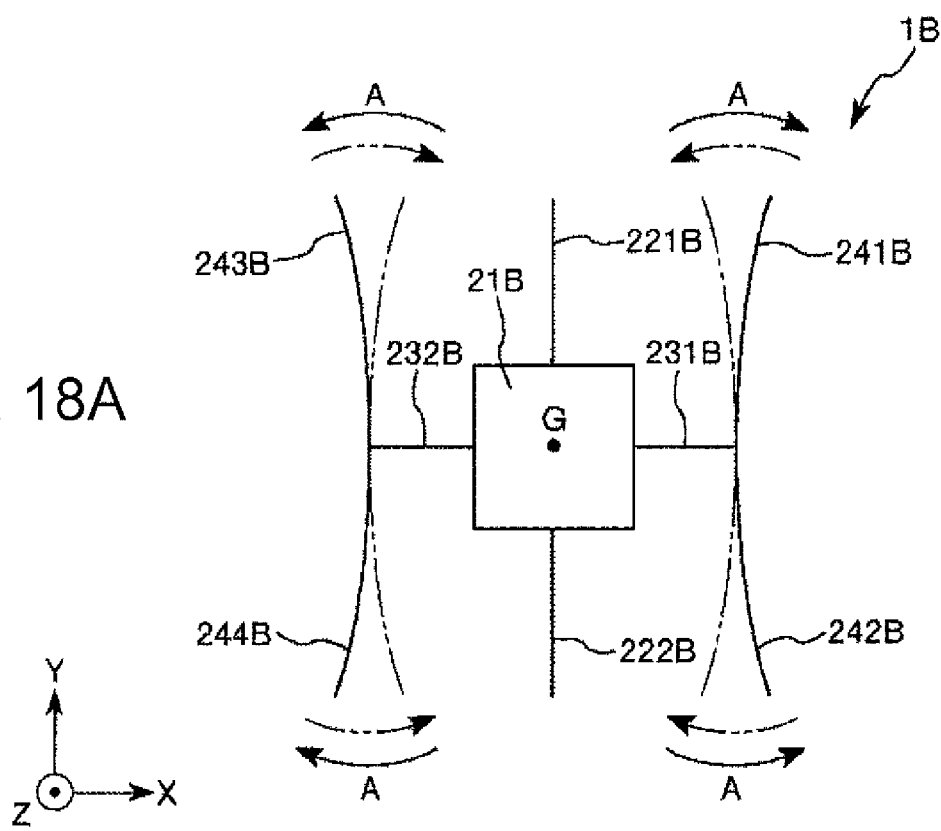
FIGS. 18A and 18B describe action of the resonator element shown in FIG. 15.
Figure 18B:
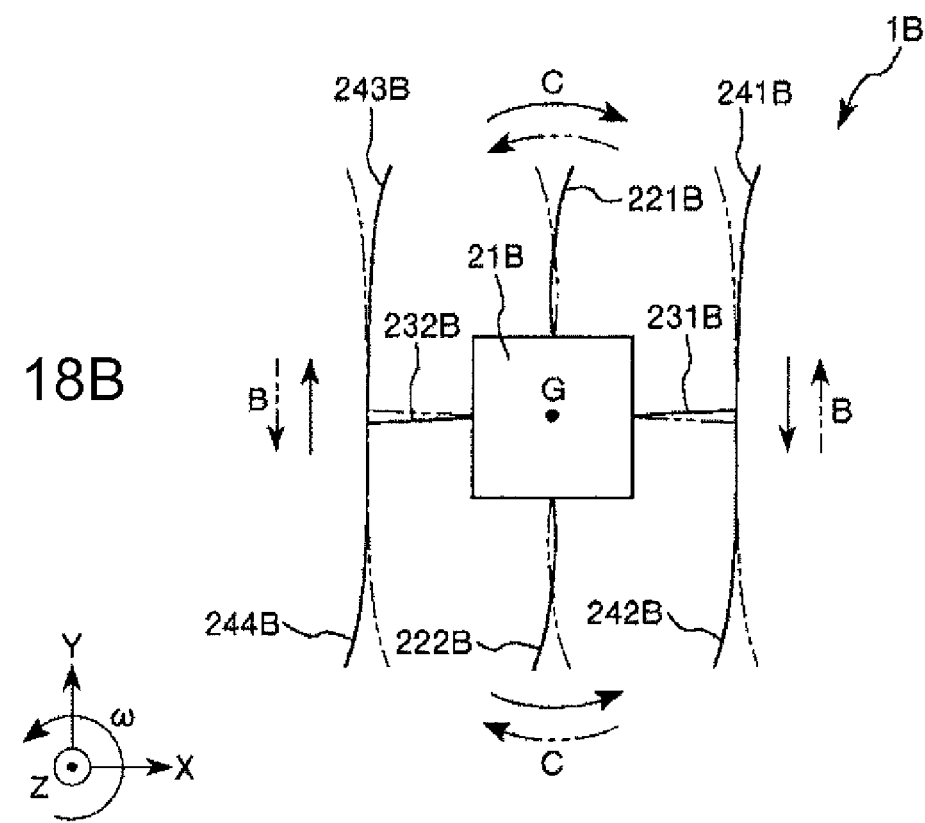

FIG. 15 is a plan view showing an resonator element of a resonator according to a third embodiment of the invention. FIG. 16 is a plan view showing electrodes provided on the resonator element shown in FIG. 15. FIG. 17 is a plan view (see-through view) showing the electrodes provided on the resonator element shown in FIG. 15. FIGS. 18A and 18B describe action of the resonator element shown in FIG. 15.

In the following description, the reader's side of the plane of view of FIGS. 15 and 16 is also called an "upper side," and the opposite side of the plane of view to the reader's side is also called a "lower side" for ease of description. Further, no electrode is shown in FIG. 15 for ease of description.

The third embodiment will be described below primarily about items different from those in the first and second embodiments described above, and the same items as those in the first and second embodiments will not be described.

Basic Structure of Resonator Element

The resonator includes a resonator element 1B shown in FIG. 15 and a package (not shown) that accommodates the resonator element 1B.

The resonator element 1B is used as an angular velocity detection device (gyro device), as shown in FIG. 15. The thus used resonator element 1B includes an resonation substrate (structural body) 2B and electrodes formed on the front surface of the resonation substrate 2B.

Resonation Substrate

The resonation substrate 2B can be made, for example, of quartz crystal, lithium tantalite, lithium niobate, or any other piezoelectric material. Among them, quartz crystal is preferably used as the material of which the resonation substrate 2B is made. Using quartz crystal allows the resonator element 1B to have an excellent frequency-temperature characteristic as compared with the other materials. The following description will be made of a case where resonation substrate 2B is made of quartz crystal.

The resonation substrate 2B has a plate-like shape that extends in an XY plane defined by a Y axis (mechanical axis, second axis) and an X axis (electrical axis, first axis) that are crystal axes of the quartz crystal substrate and has a thickness in a Z-axis (optical axis) direction as shown in FIG. 15. That is, the resonation substrate 2B is formed of a Z-cut quartz crystal plate. The Z axis preferably coincides with the thickness direction of the resonation substrate 2B but may be slightly inclined to the thickness direction (by an angle smaller than about 15°, for example) from a viewpoint of reduction in frequency-temperature change in the vicinity of room temperature.

The thus configured resonation substrate 2B has an resonation portion 20B, first and second support portions 251B, 252B, which are disposed on the opposite sides of the Y-axis direction with the resonation portion 20B therebetween, first and third beams (hanging arms) 261B, 263B, which link the first support portion 251B to the resonation portion 205, and second and fourth beams (hanging arms) 262B, 264B, which link the second support portion 252B to the resonation portion 20B.

The resonation portion 20B has a base 215, which is located in a central portion of the resonation portion 20B, a first detection arm (resonating arm) 221B and a second detection arm (resonating arm) 222B, which extend from the base 21B in opposite directions along the Y-axis direction, first and second linkage arms (support arms) 231B, 232B, which extend from the base 21B in opposite directions along the X-axis direction, first drive arm (resonating arm) 241B and second drive arm (resonating arm) 242B, which extend from a front end portion of the first linkage arm 231B in opposite directions along the Y-axis direction, and third drive arm (resonating arm) 243B and fourth drive arm (resonating arm) 244B, which extend from a front end portion of the second linkage arm 232B in opposite directions along the Y-axis direction, and the base 21B is supported by the first and second support portions 251B, 252B via the beams 261B, 262B, 263B, and 264B. The base 21B and the first and second linkage arms (support arms) 231B, 232B form a base.

The first detection arm 221B extends from the base 21B in the +Y-axis direction, and a wide-width hammer head 2211B is provided at the front end of the first detection arm 221B. On the other hand, the second detection arm 222B extends from the base 21B in the −Y-axis direction, and a wide-width hammer head 2221b is provided at the front end of the second detection arm 222B. The first and second detection arms 221B, 222B are arranged symmetrically with respect to an XZ plane passing through the center of gravity G of the resonator element 1B.

Providing the first and second detection arms 221B, 222B with the hammer heads 2211B and 2221B can improve the angular velocity detection sensitivity and shorten the first and second detection arms 221B, 222B. The hammer heads 2211B and 2221B may be provided as required and may be omitted. Further, in each of the upper and lower surfaces of each of the first and second detection arms 221B, 222B may be formed a groove having a bottom and extending in the length direction of the detection arm.

The first linkage arm 231B extends from the base 21B in the +X-axis direction. On the other hand, the second linkage arm 232B extends from the base 21B in the −X-axis direction. The first and second linkage arms 231B, 232B are arranged symmetrically with respect to a YZ plane passing through the center of gravity G. In each of the upper and lower surfaces of each of the first and second linkage arms 231B, 232B may be formed a groove having a bottom and extending in the length direction of the linkage arm (X-axis direction).

The first drive arm 241B extends from a front end portion of the first linkage arm 231B in the +Y-axis direction, and a wide-width hammer head 2411B is provided at the front end of the first drive, arm 241B. Similarly, the second drive arm 242B extends from the front end portion of the first linkage arm 231B in the −Y-axis direction, and a wide-width hammer head 2421B is provided at the front end of the second drive arm 242B. The third drive arm 243B extends from a front end portion of the second linkage arm 232B in the +Y-axis direction, and a wide-width hammer head 2431B is provided at the front end of the third drive arm 243B. The fourth drive arm 244B extends from the front end portion of the second linkage arm 232B in the −Y-axis direction, and a wide-width hammer head 2441B is provided at the front end of the fourth drive arm 244B. The four drive arms 241B, 242B, 243B, and 244B are arranged symmetrically with respect to the center of gravity G.

Providing the drive arms 241B, 242B, 243B, and 244B with the hammer heads 2411B, 2421B, 2431B, and 2441B can improve the angular velocity detection sensitivity and shorten the drive arms 241B, 242B, 243B, and 244B. The hammer heads 2411B, 2421B, 2431B, and 2441B may be provided as required and may be omitted. Further, in each of the upper and lower surfaces of each of the drive arms 241B, 242B, 243B, and 244B may be formed a groove having a bottom and extending in the length direction of the drive arm.

The first support portion 251B is located on the +Y-axis-direction side of the base 21B and extends in the X-axis direction. On the other hand, the second support portion 252B is located on the −Y-axis-direction side of the base 21B and extends in the X-axis direction. The first and second support portions 251B, 252B are arranged symmetrically with respect to the XZ plane passing through the center of gravity G.

The first beam 261B passes through the space between the first detection arm 221B and the first drive arm 241B and links the base 21B to the first support portion 251B. Similarly, the second beam 262B passes through the space between the second detection arm 222B and the second drive arm 242B and links the base 21B to the second support portion 252B. The third beam 263B passes through the space between the first detection arm 221B and the third drive arm 243B and links the base 21B to the first support portion 251B. The fourth beam 264B passes through the space between the second detection arm 222B and the fourth drive arm 244B and links the base 21B to the second support portion 252B. The beams 261B, 262B, 263B, and 264B are arranged symmetrically with respect to the center of gravity G.

The first beam 261B has a serpentine portion 261a, which is linked to the first support portion 251B, and an inclined portion 261b, which links the serpentine portion 261a to the base 21B, as shown in FIG. 15. The second beam 262B has a serpentine portion 262a, which is linked to the second support portion 252B, and an inclined portion 262b, which links the serpentine portion 262a to the base 21B. The third beam 263B has a serpentine portion 263a, which is linked to the first support portion 251B, and an inclined portion 263b, which links the serpentine portion 263a to the base 21B. The fourth beam 264B has a serpentine portion 264a, which is linked to the second support portion 252B, and an inclined portion 264b, which links the serpentine portion 264a to the base 21B.

A side surface 27B, which is disposed between a first principal surface 28B and a second principal surface 29B of the resonation substrate (structural body) 2B described above is formed of alternately arranged flat surfaces and curved surfaces, as in the first and second embodiments. As a result, durability of the resonation substrate 23 against impact due, for example, to falling thereof can be improved, and the other same advantageous effects as those provided by the first and second embodiments described above are provided.

Electrodes

Electrodes are formed on the front surface of the resonation substrate 2B.

The electrodes are formed of detection signal electrodes 311B, detection signal terminals 312B, detection grounded electrodes 321B, detection grounded terminals 322B, drive signal electrodes 331B, a drive signal terminal 332B, drive grounded electrodes 341B, and a drive grounded terminal 342B, as shown in FIGS. 16 and 17. In FIGS. 16 and 17, the detection signal electrodes 311B and the detection signal terminals 312B, the detection grounded electrodes 321B and the detection grounded terminals 322B, the drive signal electrodes 331B and the drive signal terminal 332B, and the drive grounded electrodes 341B and the drive grounded terminal 342B are hatched differently from one another for ease of description. Further, electrodes, wiring lines, and terminals formed on the side surface of the resonation substrate 2B are drawn with thick lines.

The detection signal electrodes 311B are formed on the upper and lower surfaces of the first and second detection arms 221B, 222B (on portions excluding hammer heads 2211B and 2221B). Each of the thus formed detection signal electrodes 311B is an electrode for detecting electric charge produced by the detection resonation of the first and second detection arms 221B, 222B when it is excited.

The detection signal terminals 312B are formed on right side end portions of the first and second support portions 251B, 252B. The detection signal terminal 312B formed on the first support portion 251B is electrically connected to the detection signal electrode 311B formed on the first detection arm 221B via a detection signal wiring line formed on the first beam 261B. On the other hand, the detection signal terminal 312B formed on the second support portion 252B is electrically connected to the detection signal electrode 311E formed on the second detection arm 222B via a detection signal wiring line formed on the second beam 262E.

The detection grounded electrodes 321B are formed on the opposite side surfaces of the first and second detection arms 221B, 222B. The detection grounded electrodes 321B formed on the opposite side surfaces of the first detection arm 221B are electrically connected to each other via the hammer head 2211B, and the detection grounded electrodes 321B formed on the opposite side surfaces of the second detection arm 222B are electrically connected to each other via the hammer head 2221B. The detection grounded electrodes 321B have a ground potential with respect to the detection signal electrodes 311B.

The detection grounded terminals 322B are formed on central portions of the first and second support portions 251B, 252B. The detection grounded terminal 322B formed on the first support portion 251B is electrically connected to the detection grounded electrodes 321B formed on the first detection arm 221B via a detection grounded wiring line formed on the first beam 261B. On the other hand, the detection grounded terminal 322B formed on the second support portion 252B is electrically connected to the detection grounded electrodes 321B formed on the second detection arm 222B via a detection grounded wiring line formed on the second beam 262B.

Arranging the detection signal electrodes 311B, the detection signal terminals 312B, the detection grounded electrodes 321B, and the detection grounded terminals 322B as described above allows the detection resonation that the first detection arm 221B undergoes to appear in the form of electric charge between the detection signal electrode 311B and the detection grounded electrode 321B formed on the first detection arm 221B and then allows the electric charge to be extracted in the form of a signal from the detection signal terminal 312B and the detection grounded terminal 322B formed on the first support portion 251B. Similarly, the detection resonation that the second detection arm 222B undergoes appears in the form of electric charge between the detection signal electrode 311B and the detection grounded electrode 321E formed on the second detection arm 222B, and the electric charge can be extracted in the form of a signal from the detection signal terminal 312B and the detection grounded terminal 322B formed on the second support portion 252B.

Part of the drive signal electrodes 331B are formed on the upper and lower surfaces of the first and second drive arms 241B, 242B (on portions excluding hammer heads 2411B and 2421B). The remainder of the drive signal electrodes 331B are formed on the opposite side surfaces of the third and fourth drive arms 243B, 244B. The drive signal electrodes 331B formed on the opposite side surfaces of the third drive arm 243B are electrically connected to each other via the hammer head 2431B, and the drive signal electrodes 331B formed on the opposite side surfaces of the fourth drive arm 244B are electrically connected to each other via the hammer head 2441B. The thus formed drive signal electrodes 331B are electrodes for exciting the drive resonation of the first, second, third, and fourth drive arms 241B, 242B, 243B, 244B.

The drive signal terminal 332B is formed on a left end portion of the second support portion 252B. The drive signal terminal 332B is electrically connected to the drive signal electrodes 331B formed on the first, second, third, and fourth drive arms 241B, 242B, 243B, 244B via a drive signal wiring line formed on the fourth beam 264B.

Part of the drive grounded electrodes 341B are formed on the upper and lower surfaces of the third and fourth drive arms 243B, 244B (on portions excluding hammer heads 2431B and 2441B). The remainders of the drive grounded electrodes 341B are formed on the opposite side surfaces of the first and second drive arms 241B, 242B. The drive grounded electrodes 341B formed on the opposite side surfaces of the first drive arm 241B are electrically connected to each other via the hammer head 2411B, and the drive grounded electrodes 341B formed on the opposite side surfaces of the second drive arm 242B are electrically connected to each other via the hammer head 2421B. The thus formed drive grounded electrodes 341B have a ground potential with respect to the drive signal electrodes 331B.

The drive grounded terminal 342B is formed on a left end portion of the first support portion 251B. The drive grounded terminal 342B is electrically connected to the drive grounded electrodes 341B formed on the first, second, third, and fourth drive arms 241B, 242B, 243B, 244B via a drive grounded wiring line formed on the third beam 263B.

Arranging the drive signal electrodes 331B, the drive signal terminal 332B, the drive grounded electrodes 341B, and the drive grounded terminal 342B as described above and applying a drive signal between the drive signal terminal 332B and the drive grounded terminal 342B allow electric fields to be produced between the drive signal electrodes 331B and the drive grounded electrodes 341E formed on the first, second, third, and fourth drive arms 241B, 242B, 243B, 244B so that the drive arms 241B, 242B, 243B, and 244B undergo the drive resonation.

Each of the electrodes described above is not necessarily configured in a specific manner as long as it is conductive and may be formed, for example, a metal coating produced by layering a Ni (nickel) coating, an Au (gold) coating, an Ag (silver) coating, a Cu (copper) coating, or any other coating on a metalized layer (undercoat layer) made, for example, of Cr (chromium) or W (tungsten).

Drive Operation of Resonator Element

How to drive the resonator element 1B will next be described.

In a state in which no angular velocity acts on the resonator element 1B, when a voltage (alternating voltage) is applied between the drive signal terminal 332B and the drive grounded electrode 342B to produce electric fields between the drive signal electrodes 331B and the drive grounded electrodes 341B, the drive arms 241B, 242B, 243B, and 244B undergo bending resonation in the direction indicated by the arrows A, as shown in FIG. 18A. In this process, since the first and second drive arms 241B, 242B and the third and fourth drive arms 243B, 244B resonate symmetrically with respect to the YZ plane passing through the center of gravity G of the resonator element 1B, the base 21B, the first and second detection arms 221B, 222B, and the first and second linkage arms 231B, 232B hardly resonate.

In the state in which the drive resonation occurs, when angular velocity ω around the Z axis acts on the resonator element 1B, detection resonation shown in FIG. 18B is excited. Specifically, Coriolis force in the direction indicated by the arrows B acts on the drive arms 241B, 242B, 243B, and 244B and the first and second linkage arms 231B, 232B, resulting in excitation of new resonation. The thus excited resonation in the direction indicated by the arrows B is resonation in the circumferential direction around the center of gravity G. At the same time, in response to the resonation in the direction indicated by the arrows B, detection resonation in the direction indicated by the arrows C is excited in the first and second detection arms 221B, 222B. The thus excited resonation produces electric charge in the first and second detection arms 221B, 222B, and the electric charge is extracted in the form of a signal from the detection signal electrodes 311B and the detection grounded electrodes 321B. The angular velocity is then determined based on the signal.

According to the resonator element 13, the same advantageous effects as those provided by the first and second embodiments described above are provided.

2. Electronic Apparatus

A description will next be made of an electronic apparatus (electronic apparatus according to an embodiment of the invention) including the resonator element according to any of the embodiments of the invention.

Figure 19:
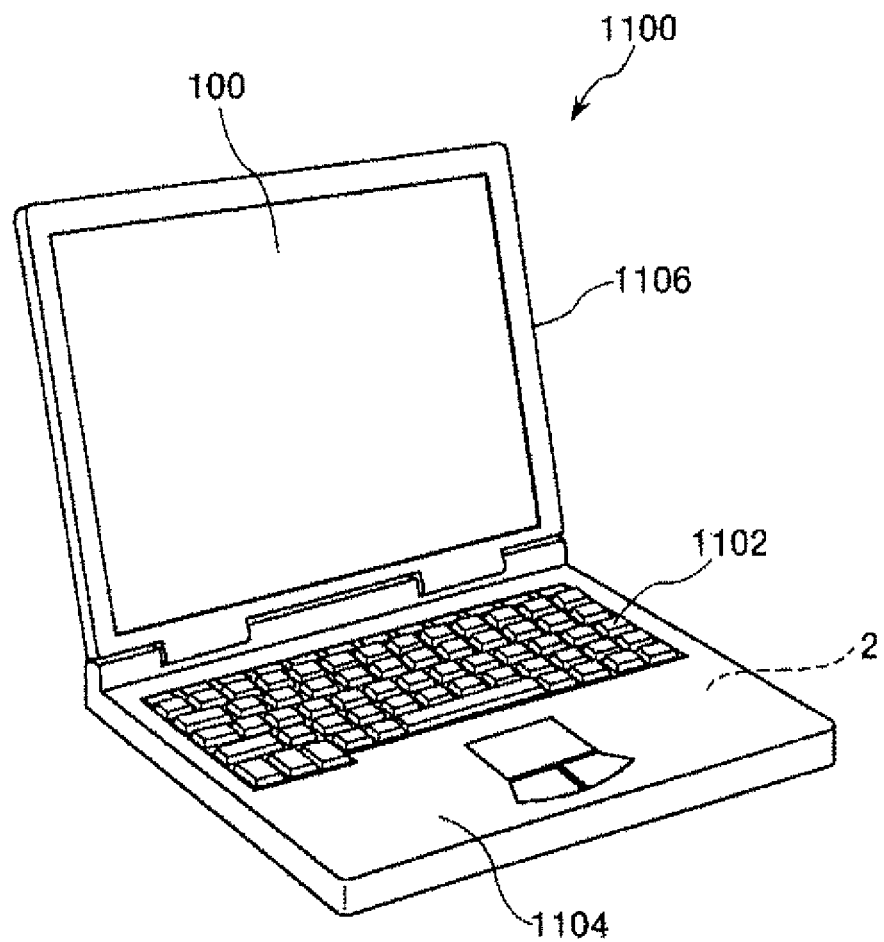
FIG. 19 is a perspective view showing the configuration of a mobile (or notebook) personal computer as an electronic apparatus according to an embodiment of the invention.

FIG. 19 is a perspective view showing the configuration of a mobile (or notebook) personal computer as the electronic apparatus according to the embodiment of the invention. In FIG. 19, a personal computer 1100 is formed of the following components: a body 1104 including a keyboard 1102; and a display unit 1106 including a display section 100, and the display unit 1106 is so supported by the body 1104 via a hinge structure that the display unit 1106 is pivotal relative to the body 1104. The thus configured personal computer 1100 accommodates the resonator element 2, which functions as a filter, a resonator, a reference clock, or any other component. The personal computer 1100 may instead accommodate the resonator element according to the second or third embodiment.

Figure 20:
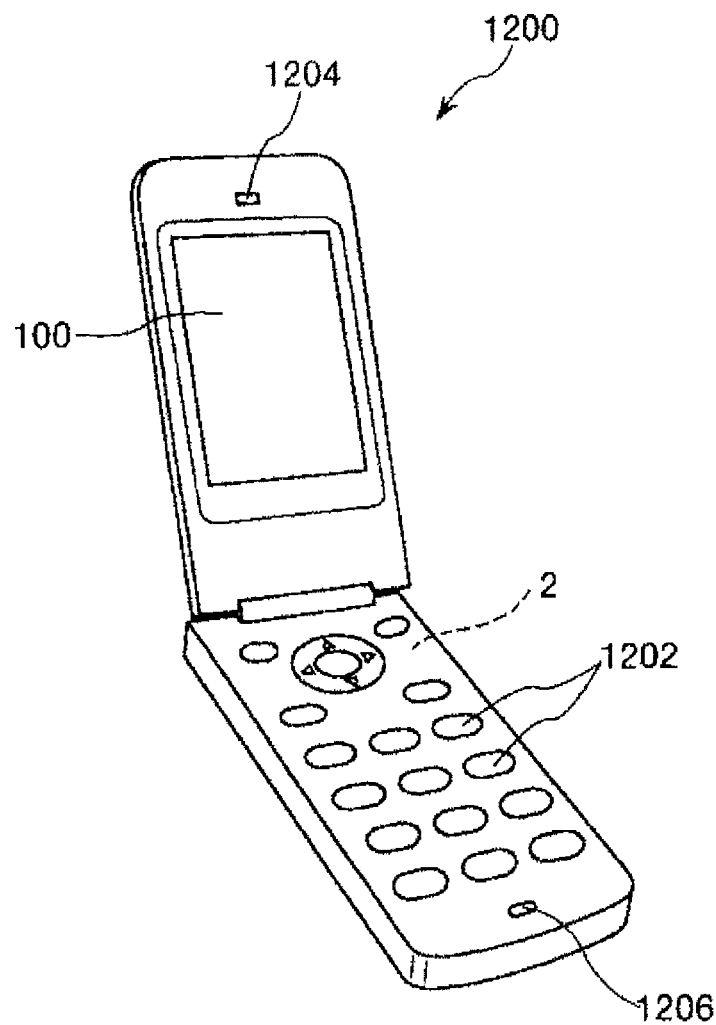
FIG. 20 is a perspective view showing the configuration of a mobile phone (including PHS) as the electronic apparatus according to the embodiment of the invention.

FIG. 20 is a perspective view showing the configuration of a mobile phone (including PHS) as the electronic apparatus according to the embodiment of the invention. In FIG. 20, a mobile phone 1200 includes a plurality of operation buttons 1202, a receiver 1204, and a transmitter 1206, and a display section 100 is disposed between the operation buttons 1202 and the receiver 1204. The thus configured mobile phone 1200 accommodates the resonator element 2, which functions as a filter, a resonator, or any other component. The mobile phone 1200 may instead accommodate the resonator element according to the second or third embodiment.

Figure 21:
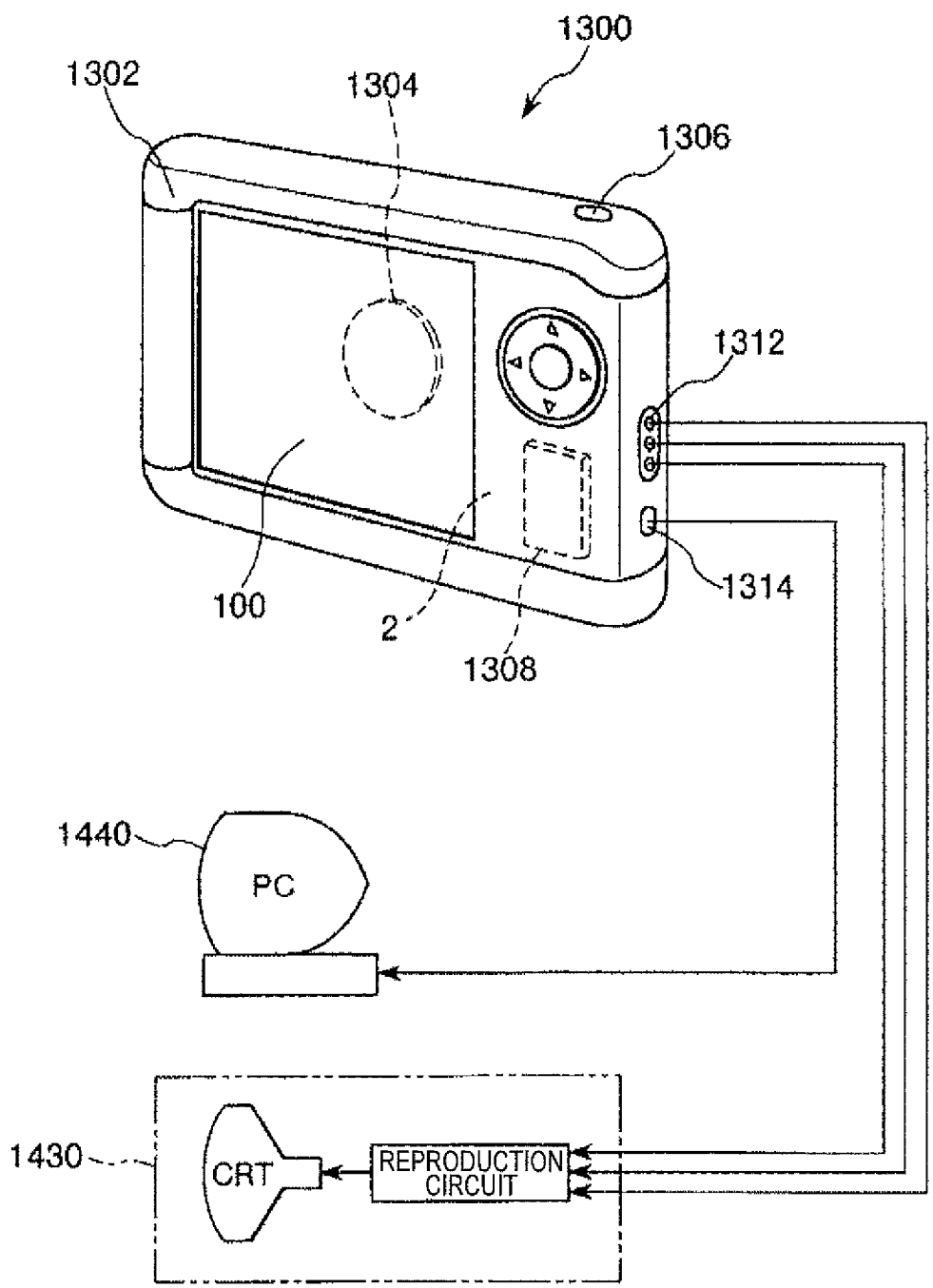
FIG. 21 is a perspective view showing the configuration of a digital still camera as the electronic apparatus according to the embodiment of the invention.

FIG. 21 is a perspective view showing the configuration of a digital still camera as the electronic apparatus according to the embodiment of the invention. FIG. 21 also schematically shows connection to external apparatus. In a typical camera, a silver photographic film is exposed to light, specifically to an optical image of a subject, whereas a digital still camera 1300 converts an optical image of a subject into a captured image signal (image signal) in a photoelectric conversion process by using a CCD (charge coupled device) or any other imaging device.

A display section 100 is provided on the rear side of a case (body) 1302 of the digital still camera 1300 and displays an image based on the captured image signal from the CCD.

The display section 100 thus functions as a finder that displays a subject in the form of an electronic image. Further, a light receiving unit 1304 including an optical lens (imaging system), the CCD, and other components is provided on the front side (rear side in FIG. 21) of the case 1302.

When a user of the camera checks a subject image displayed on the display section 100 and presses a shutter button 1306, a captured image signal from the CCD at that point of time is transferred to and stored in a memory 1308. Further, in the digital still camera 1300, a video signal output terminal 1312 and a data communication input/output terminal 1314 are provided on a side surface of the case 1302. The video signal output terminal 1312 is connected to a television monitor 1430 as necessary, and the data communication input/output terminal 1314 is connected to a personal computer 1440 as necessary, as shown in FIG. 21. Further, in response to predetermined operation, a captured image signal stored in the memory 1308 is outputted to the television monitor 1430 or the personal computer 1440. The thus configured digital still camera 1300 accommodates the resonator element 2, which functions as a filter, a resonator, or any other component. The digital still camera 1300 may instead accommodate the resonator element according to the second or third embodiment.

An electronic apparatus including the resonator element according to any of the embodiments of the invention can be used not only in the personal computer (mobile personal computer) shown in FIG. 19, the mobile phone shown in FIG. 20, and the digital still camera shown in FIG. 21 but also, for example, in an inkjet-type liquid ejection apparatus (inkjet printer, for example), a laptop personal computer, a television receiver, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, air planes, and ships), and a flight simulator.

3. Moving Object

A description will next be made of a moving object (moving object according to an embodiment of the invention) including the resonator element according to any of the embodiments of the invention.

Figure 22:
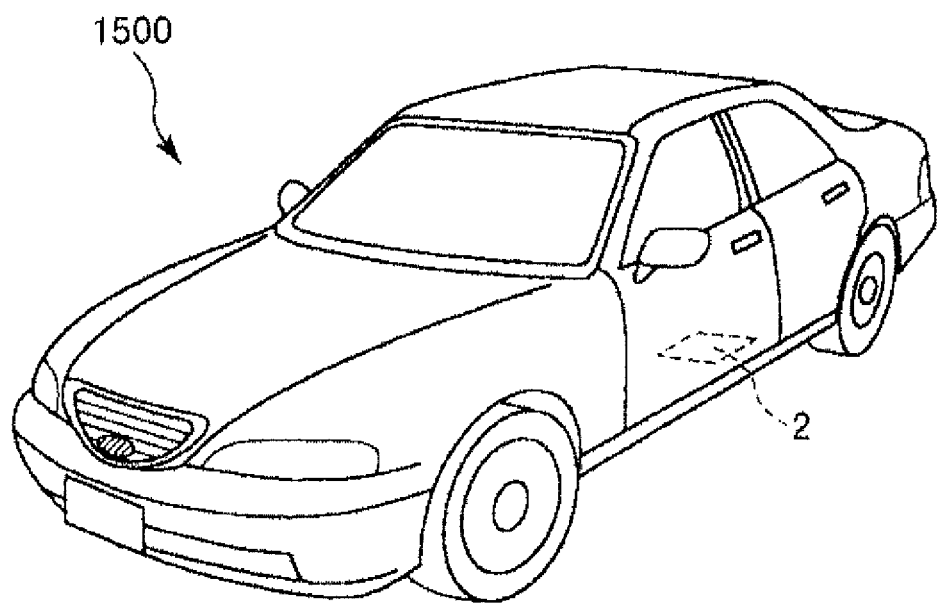
FIG. 22 is a perspective view showing the configuration of an automobile as a moving object according to an embodiment of the invention.

FIG. 22 is a perspective view showing the configuration of an automobile as the moving object according to the embodiment of the invention. An automobile 1500 accommodates the resonator element 2. The resonator element 2 can be widely used in a keyless entry system, an immobilizer, a car navigation system, a car air conditioner, an anti-lock braking system (ABS), an airbag, a tire pressure monitoring system (TPMS), an engine control system, an apparatus that monitors a battery in a hybrid automobile and an electric automobile, a vehicle body attitude control system, or any other electronic control unit (ECU). The automobile 1500 may instead accommodate the resonator elements according to the second or third embodiment.

The resonator element, the method for manufacturing the resonator element, the resonator, the gyro sensor, the electronic apparatus, and the moving body according to the illustrated embodiments of the invention have been described, but the invention is not limited thereto and the configuration of each component can be replaced with an arbitrary configuration having the same function. Further, any other arbitrary component may be added to the embodiments of the invention.

Moreover, in the invention, arbitrary two or more configurations (features) of the embodiments described above may be combined with each other.

The entire disclosure of Japanese Patent Application No. 2014-134024, filed Jun. 30, 2014 is expressly incorporated by reference herein.

What is claimed is:

1. A quartz crystal resonator element comprising;
a first principal surface;
a second principal surface that is opposite to the first principal surface; and
a side surface that connects the first principal surface and the second principal surface, wherein the side surface is formed of flat surfaces and curve-shaped surfaces formed by dry etching, and the flat surfaces and the curve-shaped surfaces are alternately arranged around an entire perimeter of the resonator element so that the side surface does not include any sharp corners formed by the joining of two consecutive flat surfaces along the perimeter.

2. The quartz crystal resonator element according to claim 1, further comprising:
a base; and
at least one resonating arm extending from the base.

3. The quartz crystal resonator element according to claim 1,
wherein the resonating arm is formed of a pair of resonating arms, and a side surface of a valley portion between the pair of resonating arms is one of the curve-shaped surfaces.

4. The quartz crystal resonator element according to claim 2,
wherein the resonating arm is formed of a pair of resonating arms, and a side surface of a valley portion between the pair of resonating arms has one of the curve-shaped surfaces.

5. The quartz crystal resonator element according to claim 1,
wherein each of the curve-shaped surfaces is a curved surface having a portion where a radius of curvature thereof is greater than or equal to 3 μm but smaller than or equal to 50 μm in a plan view of the first principal surface.

6. The quartz crystal resonator element according to claim 2,
wherein each of the curve-shaped surfaces is a curved surface having a portion where a radius of curvature thereof is greater than or equal to 3 μm but smaller than or equal to 50 μm in a plan view of the first principal surface.

7. The quartz crystal resonator element according to claim 1,
wherein the curve-shaped surfaces include a concavely curved surface and a convexly curved surface,
the concavely curved surface has a portion where a radius of curvature thereof is greater than or equal to 5 μm but smaller than or equal to 50 μm in a plan view of the first principal surface, and
the convexly curved surface has a portion where a radius of curvature thereof is greater than or equal to 3 μm but smaller than or equal to 30 μm in the plan view of the first principal surface.

8. The quartz crystal resonator element according to claim 2,
wherein the curve-shaped surfaces include a concavely curved surface and a convexly curved surface,
the concavely curved surface has a portion where a radius of curvature thereof is greater than or equal to 5 μm but smaller than or equal to 50 μm in a plan view of the first principal surface, and
the convexly curved surface has a portion where a radius of curvature thereof is greater than or equal to 3 μm but smaller than or equal to 30 μm in the plan view of the first principal surface.

9. The quartz crystal resonator element according to claim 1,
wherein the curve-shaped surfaces include a concavely curved surface and a convexly curved surface, and
an average radius of curvature of the concavely curved surface is greater than the average radius of curvature of the convexly curved surface in a plan view of the first principal surface.

10. The quartz crystal resonator element according to claim 2,
wherein the curve-shaped surfaces include a concavely curved surface and a convexly curved surface, and
an average radius of curvature of the concavely curved surface is greater than the average radius of curvature of the convexly curved surface in a plan view of the first principal surface.

11. A quartz crystal resonator comprising:
the quartz crystal resonator element according to claim 1; and
a package that accommodates the quartz crystal resonator element.

12. A quartz crystal resonator comprising:
the quartz crystal resonator element according to claim 2; and
a package that accommodates the quartz crystal resonator element.

13. A gyro sensor comprising the quartz crystal resonator element according to claim 1.

14. An electronic apparatus comprising the quartz crystal resonator element according to claim 1.

15. A moving object comprising the quartz crystal resonator element according to claim 1.

* * * * *